US012813085B2

(12) United States Patent
Choi

(10) Patent No.: US 12,813,085 B2
(45) Date of Patent: Nov. 24, 2026

(54) DISPLAY DEVICE

(71) Applicant: Samsung Display Co., LTD., Yongin-si (KR)

(72) Inventor: Sang Hyun Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 513 days.

(21) Appl. No.: 18/466,036

(22) Filed: Sep. 13, 2023

(65) Prior Publication Data

US 2024/0276785 A1 Aug. 15, 2024

(30) Foreign Application Priority Data

Feb. 9, 2023 (KR) ........................ 10-2023-0017441

(51) Int. Cl.

*H10K 59/122* (2023.01)
*H10K 59/38* (2023.01)
*H10K 59/40* (2023.01)
*H10K 59/80* (2023.01)
*H10K 102/00* (2023.01)

(52) U.S. Cl.

CPC ........... *H10K 59/122* (2023.02); *H10K 59/38* (2023.02); *H10K 59/40* (2023.02); *H10K 59/8792* (2023.02); *H10K 2102/311* (2023.02); *H10K 2102/351* (2023.02)

(58) Field of Classification Search

CPC ...... H10K 59/122; H10K 59/38; H10K 59/40; H10K 59/8792; H10K 2102/311; H10K 2102/351; H10K 50/865; H10K 59/352; H10K 59/12; H10K 59/126

See application file for complete search history.

(56) References Cited

U.S. PATENT DOCUMENTS

| | | | | |
|---|---|---|---|---|
| 2005/0007525 A1* | 1/2005 | Jun | G02F 1/13394 | 349/110 |
| 2021/0376021 A1* | 12/2021 | Joo | H10K 59/122 | |
| 2022/0130925 A1* | 4/2022 | Takahashi | H10K 50/11 | |
| 2023/0082085 A1* | 3/2023 | Xiao | H10K 59/8792 | 257/91 |
| 2023/0117024 A1* | 4/2023 | Kubota | H10K 59/38 | 257/40 |
| 2023/0180570 A1* | 6/2023 | Lee | G06V 10/147 | 257/40 |

FOREIGN PATENT DOCUMENTS

| | | |
|---|---|---|
| CN | 111025740 | 4/2020 |
| CN | 112034650 | 12/2020 |
| CN | 113449575 | 9/2021 |
| KR | 10-2019-0008066 | 1/2019 |
| KR | 10-2423476 | 7/2022 |

* cited by examiner

*Primary Examiner* — Kevin Quarterman
(74) *Attorney, Agent, or Firm* — F. CHAU & ASSOCIATES, LLC

(57) ABSTRACT

A display device includes a first display area including multiple emission areas that each include a light emitting element and a second display area including the emission areas and multiple light transmitting areas, a pixel defining film including multiple openings overlapping the emission areas and the light transmitting areas, a light blocking layer including multiple holes overlapping the emission areas and the light transmitting areas, and multiple color filters disposed in the holes of the light blocking layer and overlapping the emission areas.

20 Claims, 28 Drawing Sheets

TSU : SIL1, SIL2, SIL3, TL

TSU : SIL1, SIL2, SIL3, TL

TSU : SIL1, SIL2, SIL3, TL

TSU : SIL1, SIL2, SIL3, TL

TSU : SIL1, SIL2, SIL3, TL

TSU : SIL1, SIL2, SIL3, TL

TSU : SIL1, SIL2, SIL3, TL

DISPLAY DEVICE

CROSS-REFERENCE TO RELATED APPLICATIONS

This application claims priority under 35 U.S.C. § 119 from Korean Patent Application No. 10-2023-0017441 filed on Feb. 9, 2023 in the Korean Intellectual Property Office, the entire contents of which are incorporated herein by reference.

BACKGROUND

1. Technical Field

The disclosure relates to a display device.

2. Description of the Related Art

As the information society develops, the demand for display devices for displaying images has increased and diversified. For example, display devices have been applied to various electronic devices such as smartphones, digital cameras, laptop computers, navigation devices, and smart televisions. The display devices may be flat panel display devices such as liquid crystal display devices, field emission display devices, or organic light emitting display devices. Among such flat panel display devices, a light emitting display device may display an image without a backlight part providing light to a display panel because each of pixels of the display panel includes multiple light emitting elements that may emit light by themselves.

Recent display devices have supported an input using a portion (e.g., a finger) of a user's body and an input using an input pen. The display device may sense the input more precisely in case of using the input pen as compared to a finger.

SUMMARY

Aspects of the disclosure provide a display device in which color filters disposed over an entire surface of a display area have a uniform thickness.

Aspects of the disclosure also provide a display device having uniform luminance over an entire surface of the display area.

However, aspects of the disclosure may not be limited to those set forth herein. The above and other aspects of the disclosure will become more apparent to one of ordinary skill in the art to which the disclosure pertains by referencing the detailed description of the embodiments given below.

According to an embodiment of the disclosure, a display device may include a plurality of emission areas, each of the plurality of emission areas may include a light emitting element, wherein some of the plurality of emission areas may be disposed in a first display area and others of the plurality of emission areas may be disposed in a second display area, a plurality of light transmitting areas disposed in the second display area, each of the plurality of light transmitting areas may be absent of light emitting elements, a pixel defining film including a plurality of openings, the plurality of openings may overlap corresponding ones of the plurality of emission areas and/or corresponding ones of the plurality of light transmitting areas, a light blocking layer including a plurality of holes overlapping corresponding ones of the plurality of emission areas and/or corresponding ones of the plurality of light transmitting areas, the light blocking layer may be disposed between adjacent ones of the plurality of emission areas and between adjacent ones of the plurality of light transmitting areas, and a plurality of color filters overlapping corresponding ones of the plurality of holes of the light blocking layer and overlapping corresponding ones of the plurality of emission areas, wherein the light blocking layer may include a first light blocking layer and a second light blocking layer disposed on the first light blocking layer, the second light blocking layer may have a width smaller than a width of the first light blocking layer, in the first display area, the plurality of color filters disposed adjacent to each other may be spaced apart from each other by a distance at locations corresponding to the second light blocking layer, in the second display area, the plurality of color filters may not be disposed on the plurality of light transmitting areas and the second light blocking layer may be disposed to surround ones of the plurality of light transmitting areas, and a diameter of each of the plurality of openings of the pixel defining film may be smaller than a diameter of a corresponding one of the plurality of holes of the light blocking layer.

A difference between the width of the first light blocking layer and the width of the second light blocking layer may be at least about 4 μm, and a thickness of the first light blocking layer may be smaller than a thickness of the second light blocking layer.

The thickness of the first light blocking layer may be in a range of about 1.5 μm to about 2.5 μm, and the thickness of the second light blocking layer may be in a range of about 1.5 μm to about 4 μm.

The width of the first light blocking layer may be at least about 13 μm, and the width of the second light blocking layer may be at least about 9 μm.

The second light blocking layer and the first light blocking layer may be integral with each other.

A portion of an upper surface of the second light blocking layer may not overlap the plurality of color filters.

A portion of an upper surface of the first light blocking layer disposed in the second display area may not overlap the color filter and the second light blocking layer.

The second light blocking layer may be disposed adjacent to one of both sides of the first light blocking layer in a width direction on the first light blocking layer.

In the second display area, the second light blocking layer may be disposed to be disposed to surround ones of the plurality of light transmitting areas.

Each of the emission areas may include a first emission area, a second emission area spaced apart from the first emission area in a first direction, and a third emission area spaced apart from the second emission area in a second direction intersecting the first direction, and each of the color filters may include a first color filter overlapping the first emission area, a second color filter overlapping the second emission area, and a third color filter overlapping the third emission area.

An area of the first color filter in a plan view may be greater than or equal to areas of each of the second color filter and the third color filter in a plan view The area of the first color filter in a plan view may be greater than the area of the third color filter in a plan view, and the second color filter may have a shape in which it extends in a plan view.

According to an embodiment of the disclosure, a display device may include a plurality of emission areas disposed in a first direction, a second direction crossing the first direction, and a third direction crossing the first direction and the second direction, each of the plurality of emission areas may include a light emitting element, a plurality of light transmitting areas disposed between ones of the plurality of emission areas, each of the plurality of light transmitting areas may be absent of the plurality of light emitting elements, a light blocking layer including a plurality of holes, each of the plurality of holes may overlap corresponding ones of the plurality of emission areas and corresponding ones of the plurality of light transmitting areas, the light blocking layer may be disposed to surround ones of the plurality of emission areas and ones of the plurality of light transmitting areas, and a plurality of color filters disposed in corresponding ones of the plurality of holes of the light blocking layer and overlapping corresponding ones of the plurality of emission areas, wherein each of the plurality of emission areas may include a first emission area, a second emission area spaced apart from the first emission area in the first direction, and a third emission area spaced apart from the second emission area in the second direction, each of the plurality of color filters may include a first color filter overlapping the first emission area, a second color filter overlapping the second emission area, and a third color filter overlapping the third emission area, portions of the second color filter may be disposed on portions of the first color filter adjacent thereto in the first direction and on portions of the third color filter adjacent thereto in the second direction, and the light blocking layer may include a first light blocking layer and a color pattern disposed on the first light blocking layer, wherein the plurality of holes may be disposed in the first light blocking layer, the color pattern may surround ones of the plurality of light transmitting areas, the color pattern may have a width smaller than that of the first light blocking layer.

The color pattern may include a same colorant as the first color filter, and the first color filter adjacent to the light transmitting area and the color pattern may be integral with each other.

The second color filter may overlap each of the first color filter or the third color filter at locations corresponding to the first light blocking layer.

A portion of the third color filter may be disposed on the first color filter at a location corresponding to the first light blocking layer.

A difference between the width of the first light blocking layer and the width of the color pattern may be at least about 4 μm.

A thickness of the first light blocking layer may be in a range of about 1.5 μm to about 2.5 μm, and a thickness of the color pattern may be in a range of about 1.5 μm to about 4 μm.

Portions of the light blocking layer disposed around ones of the plurality of emission areas may be covered by the plurality of color filters, and a portion of an upper surface of the light blocking layer disposed around ones of the plurality of light transmitting areas may not overlap the color filter.

Each of the plurality of holes of the light blocking layer may have a greater area than corresponding ones of the plurality of emission areas, and each of the first color filter, the second color filter, and the third color filter may have a greater area than a corresponding one of the plurality of holes.

A display device according to an embodiment may include areas where color filters may not be partially disposed in a display area, but the color filters disposed over an entire surface of the display area may have a uniform thickness, and accordingly, the display device may have uniform luminance over the entire surface of the display area.

The display device according to an embodiment may include portions where the color filters partially overlap each other in the display area, but a light blocking layer may include a color pattern compensating for a height of the portions where the color filters overlap each other. In the display device, the color filters disposed over the entire surface of the display area may have a uniform thickness, and accordingly, the display device may have uniform luminance over the entire surface of the display area.

The effects of the disclosure may not be limited to the aforementioned effects, and various other effects may be included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
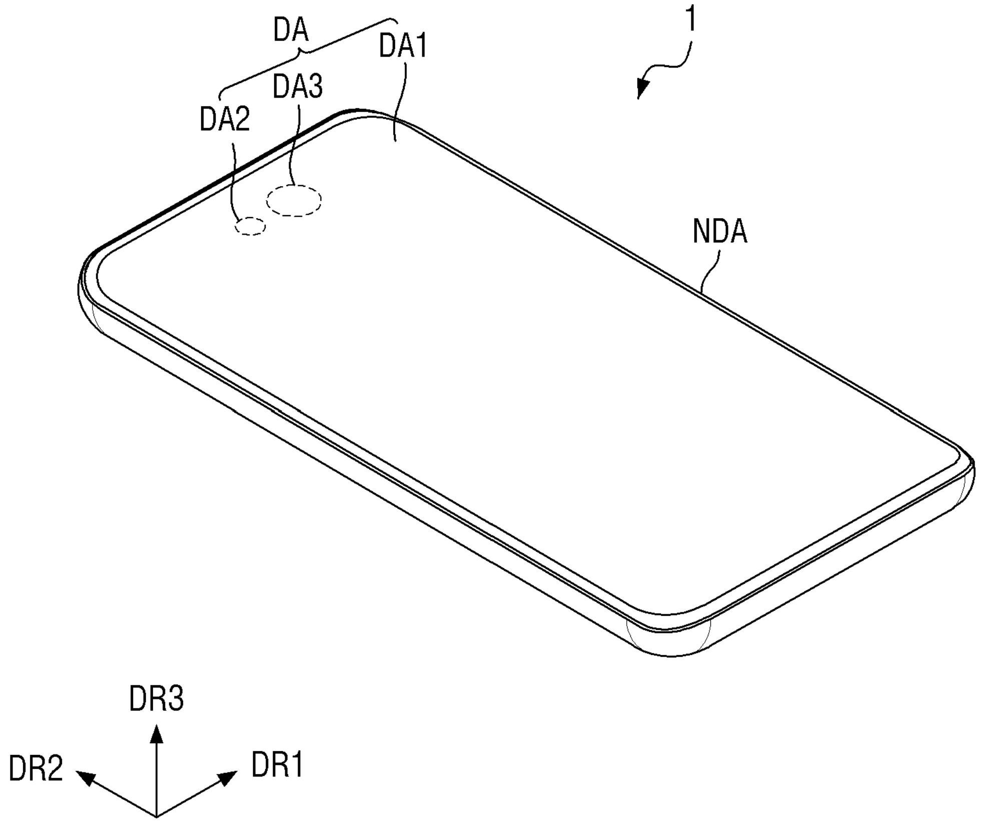
FIG. 1 is a schematic perspective view of an electronic device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in an embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be predisposed differently from the described order. For example, two consecutively described processes may be predisposed substantially at a same time or predisposed in an order opposite to the described order. Also, like reference numerals and/or reference characters denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. Further, the X-axis, the Y-axis, and the Z-axis may not be limited to three axes of a rectangular coordinate system, such as the x, y, and z axes, and may be interpreted in a broader sense. For example, the X-axis, the Y-axis, and the Z-axis may be perpendicular to one another, or may be different directions that may not be perpendicular to one another.

For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items. A description that a component is "configured to" perform a specified operation may be defined as a case where the component is constructed and arranged with structural features that can cause the component to perform the specified operation.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including,"

when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, may not be necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be disposed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, portion, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein. Hereinafter, embodiments will be described with reference to the accompanying drawings.

FIG. 1 is a schematic perspective view of an electronic device according to an embodiment. Referring to FIG. 1, an electronic device 1 displays a moving image or a still image. The electronic device 1 may refer to all electronic devices that provide display screens. For example, televisions, laptop computers, monitors, billboards, the Internet of Things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, camcorders, and the like, which provide display screens, may be included in the electronic device 1.

The electronic device 1 may include a display device 10 (see FIG. 4) providing a display screen. Examples of the display device may include an inorganic light emitting diode display device, an organic light emitting display device, a quantum dot light emitting display device, a plasma display device, a field emission display device, and the like. Hereinafter, a case where an inorganic light emitting diode display device may be applied as an example of the display device will be described by way of example, but the disclosure may not be limited thereto, and the same technical spirit may be applied to other display devices if applicable.

A shape of the electronic device 1 may be variously modified. For example, the electronic device 1 may have a shape such as a rectangular shape with a width greater than a length, a rectangular shape with a length greater than a width, a square shape, a rectangular shape with rounded corners (vertices), other polygonal shapes, or a circular shape. A shape of a display area DA of the electronic device 1 may also be similar to an overall shape of the electronic device 1. In FIG. 1, the electronic device 1 having a rectangular shape with a great length in a second direction DR2 has been illustrated.

The electronic device 1 may include a display area DA and a non-display area NDA. The display area DA may be an area in which a screen may be displayed, and the non-display area NDA may be an area in which a screen may not be displayed. The display area DA may also be referred to as an active area, and the non-display area NDA may also be referred to as a non-active area. The display area DA may occupy substantially the center of the electronic device 1.

The display area DA may include a first display area DA1, a second display area DA2, and a third display area DA3. The second display area DA2 and the third display area DA3 may be areas in which components for adding various functions to the electronic device 1 may be disposed, and may correspond to component areas.

Figure 2:
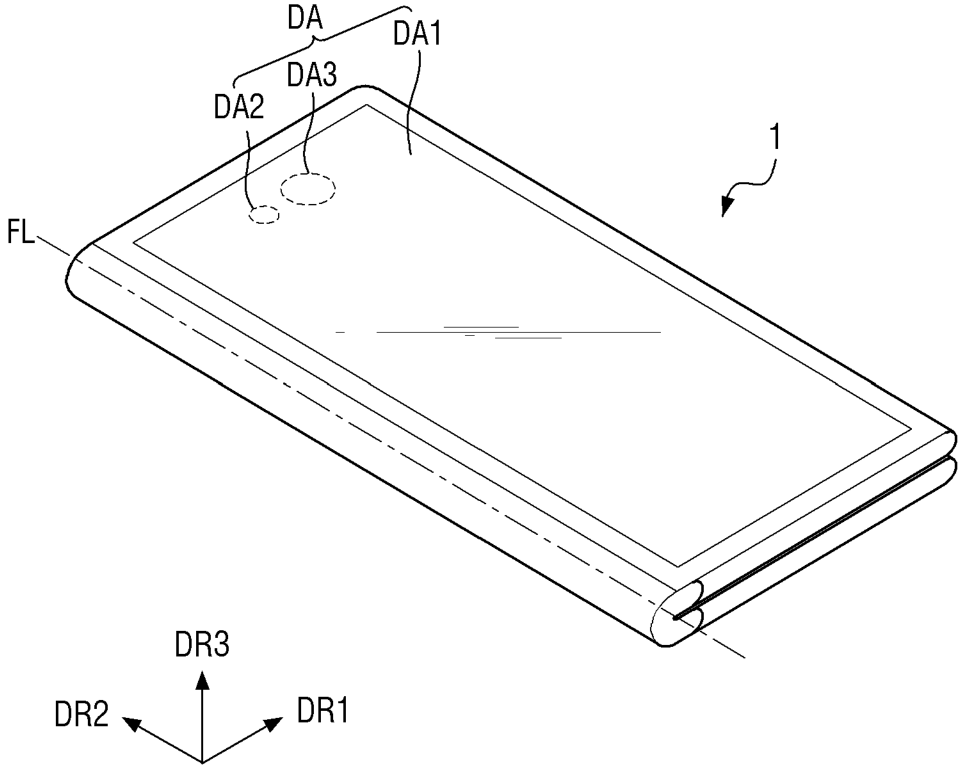
FIG. 2 is a perspective view illustrating a folded state of a foldable electronic device according to an embodiment.
Figure 3:
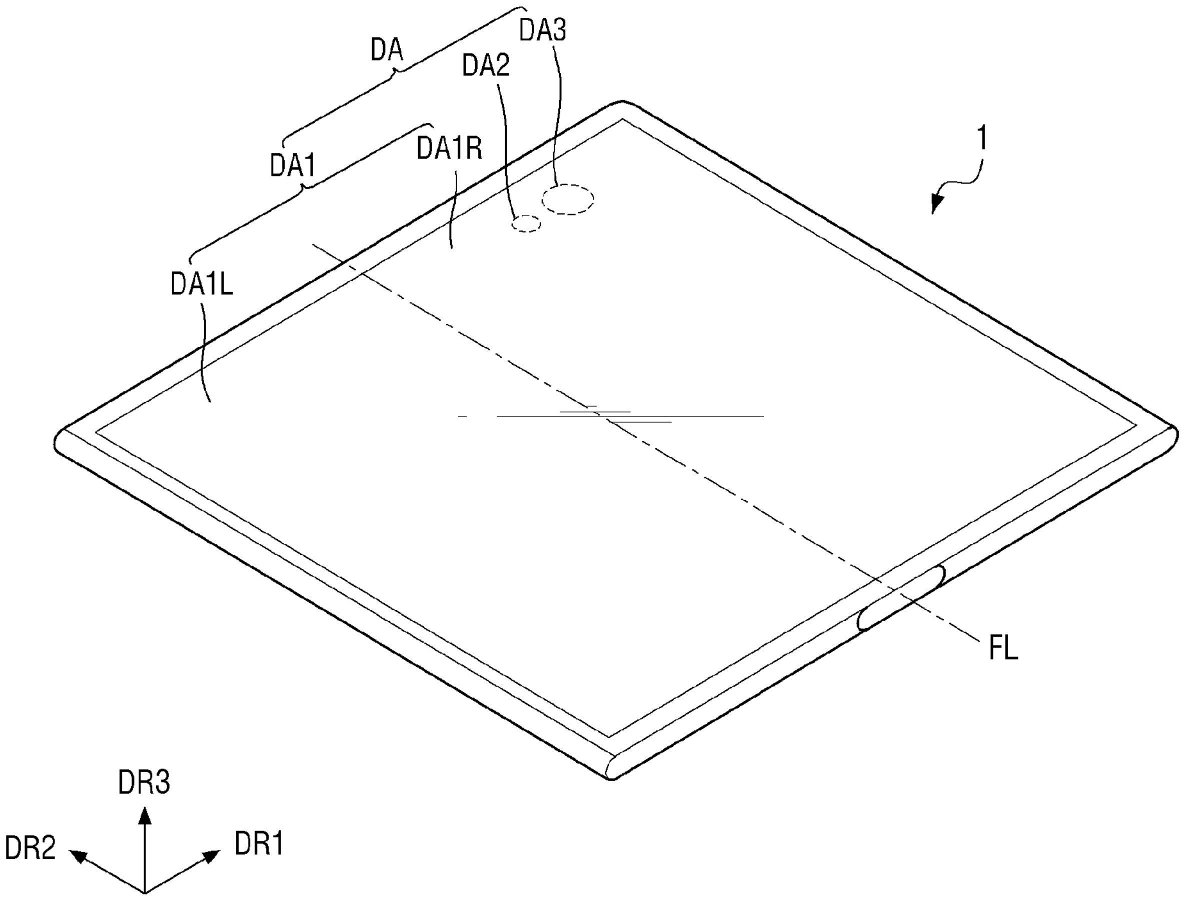
FIG. 3 is a perspective view illustrating an unfolded state of the foldable electronic device of FIG. 2.

FIG. 2 is a perspective view illustrating a folded state of a foldable electronic device according to an embodiment. FIG. 3 is a perspective view illustrating an unfolded state of the foldable electronic device of FIG. 2.

Referring to FIGS. 2 and 3, the foldable electronic device 1 according to an embodiment may be a foldable display device. The foldable electronic device 1 may be folded around a folding axis FL. A display area DA may be disposed outside and/or inside the foldable electronic device 1. In an embodiment, it has been illustrated in FIGS. 2 and 3 that the display area DA may be disposed outside and inside the foldable electronic device 1.

The display area DA may be disposed on an outer side surface of the electronic device 1. The outer side surface of the folded electronic device 1 may include the display area DA, and an inner side surface of the unfolded electronic device 1 may include the display area DA.

In the foldable electronic device 1 of FIG. 3, the display area DA may include a first display area DA1 occupying most of the display area DA and a second display area DA2 and a third display area DA3 occupying relatively small areas as compared the first display area DA1.

The first display area DA1 may include a first display part DA1L and a second display part DA1R disposed on both sides of the folding axis FL. The second display area DA2 and the third display area DA3 may be disposed in an area in which the second display part DA1R may be disposed, but may not be limited thereto. In another embodiment, the second display area DA2 and the third display area DA3 may instead be disposed in an area in which the first display part DA1L may be disposed or any one of the second display area DA2 and the third display area DA3 may be disposed in the first display part DA1L and another of the second display area DA2 and the third display area DA3 may be disposed in the second display part DA1R.

As illustrated in FIGS. 1 to 3, each of the second display area DA2 and the third display area DA3 may have a smaller area than the first display area DA1. The second display area DA2 and the third display area DA3 may have different sizes or areas, but may not be limited thereto. In the following drawings, a case where the second display area DA2 has a smaller area than the third display area DA3 will be illustrated. Each of the second display area DA2 and the third display area DA3 may be surrounded by the first display area DA1. However, the disclosure may not be limited thereto.

Figure 4:
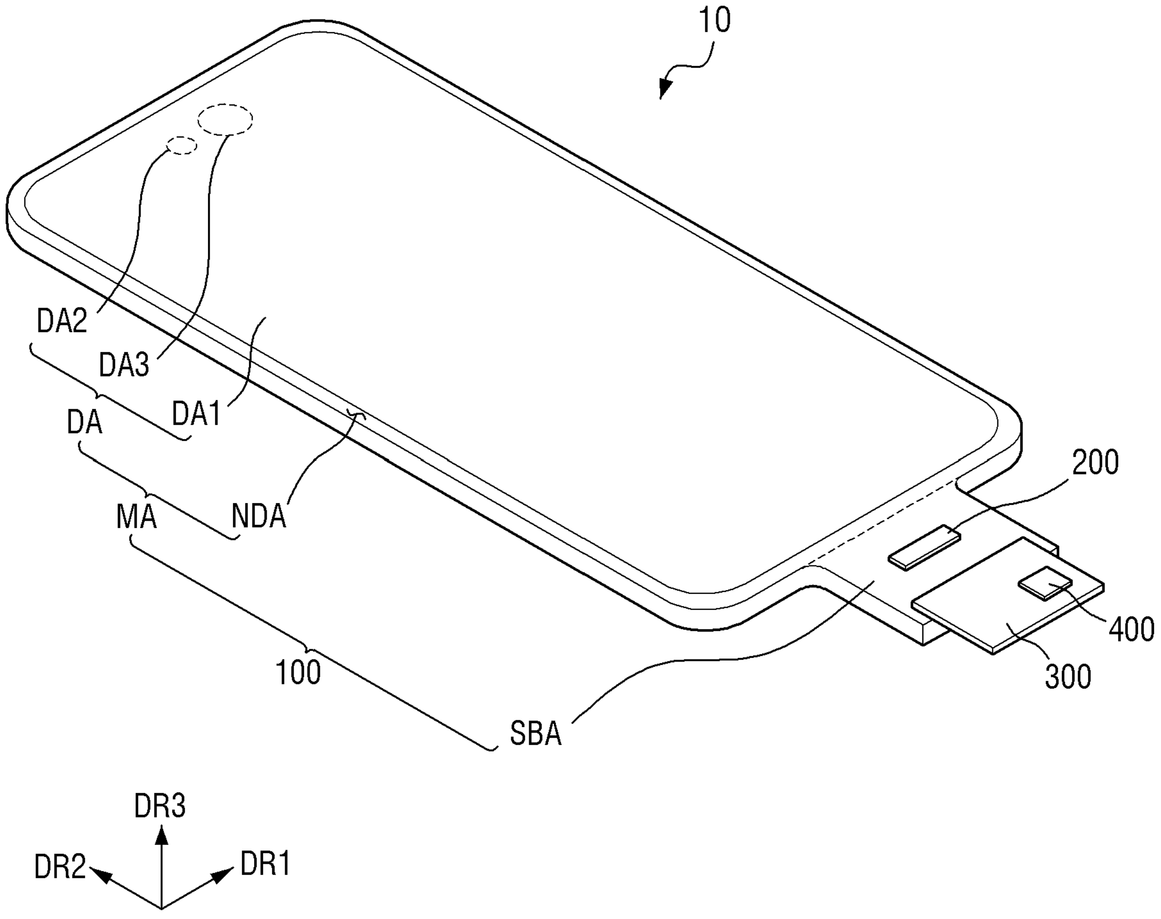
FIG. 4 is a perspective view illustrating a display device included in the electronic device according to an embodiment.

FIG. 4 is a perspective view illustrating a display device included in the electronic device according to an embodiment. Referring to FIG. 4, the electronic device 1 according to an embodiment may include a display device 10. The display device 10 may provide a screen displayed by the electronic device 1. The display device 10 may have a shape similar to that of the electronic device 1 in a plan view. For example, the display device 10 may have a shape similar to a rectangular shape having short sides in a first direction DR1 and long sides in a second direction DR2. A corner where the short side in the first direction DR1 and the long side in the second direction DR2 meet may be rounded with a curvature, but may not be limited thereto, and may also be right-angled. The shape of the display device 10 in a plan view may not be limited to the rectangular shape, and may be a shape similar to other polygonal shapes, a circular shape, or an elliptical shape.

The display device 10 may include a display panel 100, a display driver 200, a circuit board 300, and a touch driver 400. The display panel 100 may include a main area MA and a sub-area SBA. The main area MA may include a display area DA including pixels displaying an image and a non-display area NDA disposed around the display area DA. The display area DA may include a first display area DA1, a second display area DA2, and a third display area DA3. The display area DA may emit light from multiple emission areas or multiple opening areas. For example, the display panel 100 may include pixel circuits including switching elements, a pixel defining film defining the emission areas or the opening areas, and self-light emitting elements. For example, the self-light emitting element may include at least one of an organic light emitting diode (LED) including an organic light emitting layer, a quantum dot LED including a quantum dot light emitting layer, an inorganic LED including an inorganic semiconductor, and a micro LED, but may not be limited thereto.

The non-display area NDA may be an area outside the display area DA. The non-display area NDA may be defined as an edge area of the main area MA of the display panel 100. The non-display area NDA may include a gate driver (not illustrated) supplying gate signals to gate lines, and fan-out lines (not illustrated) connecting the display driver 200 and the display area DA to each other.

The sub-area SBA may be an area extending from one side of the main area MA. The sub-area SBA may include a flexible material that may be bent, folded, and rolled. For example, in case that the sub-area SBA is bent, the sub-area SBA may overlap the main area MA in a thickness direction (third direction DR3). The sub-area SBA may include the display driver 200 and pad parts electrically connected to the circuit board 300. In an embodiment, the sub-area SBA may be omitted, and the display driver 200 and the pad parts may be disposed in the non-display area NDA.

The display driver 200 may output signals and voltages for driving the display panel 100. The display driver 200 may supply data voltages to data lines. The display driver 200 may supply source voltages to power lines and supply gate control signals to the gate driver. The display driver 200 may be formed as an integrated circuit (IC) and be mounted on the display panel 100 in a chip on glass (COG) manner, a chip on plastic (COP) manner, or an ultrasonic bonding manner. As an example, the display driver 200 may be disposed in the sub-area SBA, and may overlap the main area MA in the thickness direction by bending of the sub-area SBA. As another example, the display driver 200 may be mounted on the circuit board 300.

The circuit board 300 may be attached onto the pad parts of the display panel 100 using an anisotropic conductive film (ACF). Lead lines of the circuit board 300 may be electrically connected to the pad parts of the display panel 100. The circuit board 300 may be a flexible printed circuit board, a printed circuit board, or a flexible film such as a chip on film.

The touch driver 400 may be mounted on the circuit board 300. The touch driver 400 may be electrically connected to a touch sensing part of the display panel 100. The touch driver 400 may supply touch driving signals to multiple touch electrodes of the touch sensing part and sense changes in capacitance between the touch electrodes. For example, the touch driving signal may be a pulse signal having a frequency (e.g., predetermined or selectable frequency). The touch driver 400 may decide whether or not an input has occurred and calculate input coordinates based on the change amounts in capacitance between the touch electrodes. The touch driver 400 may be formed as an integrated circuit (IC).

Figure 5:
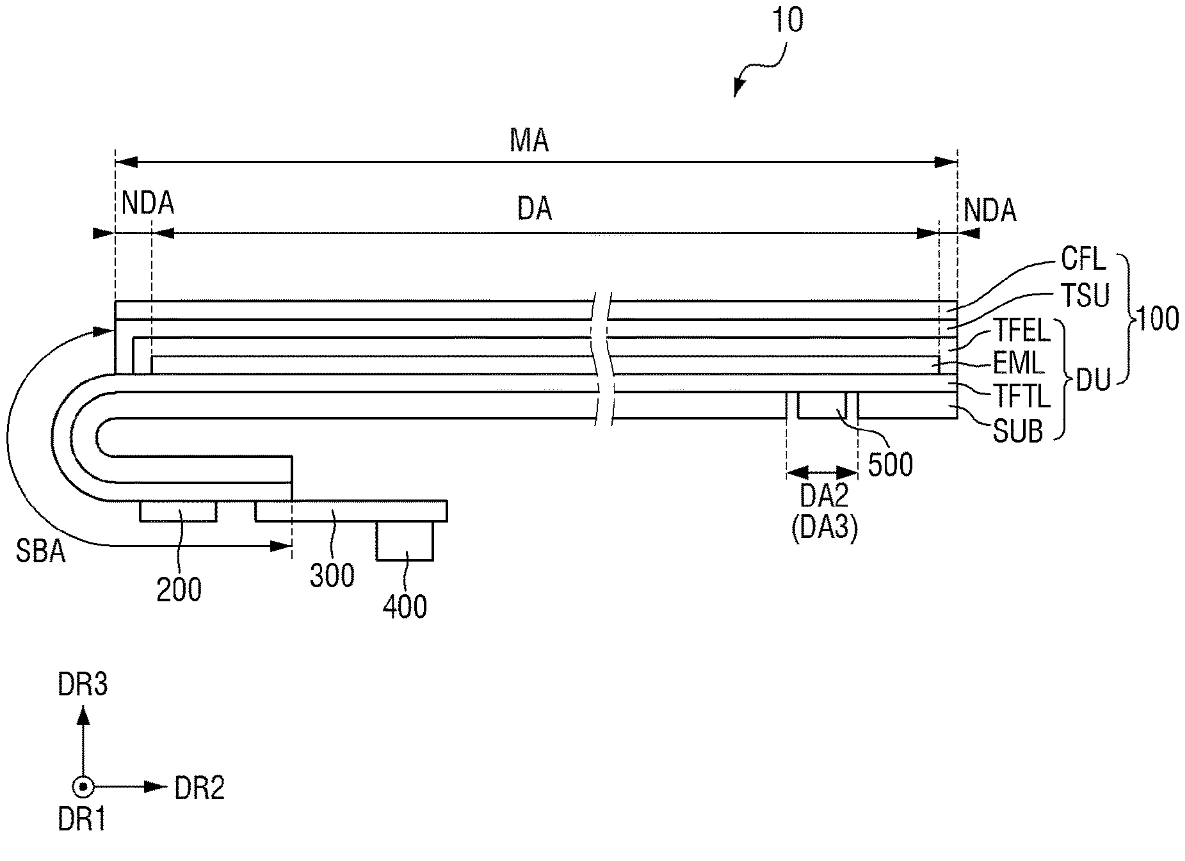
FIG. 5 is a schematic cross-sectional view of the display device of FIG. 4 viewed from the side.

FIG. 5 is a schematic cross-sectional view of the display device of FIG. 4 viewed from the side. Referring to FIG. 5, the display panel 100 may include a display layer DU, a touch sensing layer TSU, and a color filter layer CFL. The display layer DU may include a substrate SUB, a thin film transistor layer TFTL, a light emitting element layer EML, and an encapsulation layer TFEL.

The substrate SUB may be a base substrate or a base member. The substrate SUB may be a flexible substrate that may be bent, folded, and rolled. For example, the substrate SUB may include a polymer resin such as polyimide (PI), but may not be limited thereto. In an embodiment, the substrate SUB may include a glass material or a metal material.

The thin film transistor layer TFTL may be disposed on the substrate SUB. The thin film transistor layer TFTL may include multiple thin film transistors constituting pixel circuits of pixels. The thin film transistor layer TFTL may further include gate lines, data lines, power lines, gate control lines, fan-out lines connecting the display driver 200 and the data lines to each other, and lead lines connecting the display driver 200 and the pad parts to each other. Each of the thin film transistors may include a semiconductor region, a source electrode, a drain electrode, and a gate electrode. For example, in case that the gate driver is formed on one side of the non-display area NDA of the display panel 100, the gate driver may include thin film transistors.

The thin film transistor layer TFTL may be disposed in the display area DA, the non-display area NDA, and the sub-area SBA. The thin film transistors of each of the pixels, the gate lines, the data lines, and the power lines of the thin film transistor layer TFTL may be disposed in the display area DA. The gate control lines and the fan-out lines of the thin film transistor layer TFTL may be disposed in the non-display area NDA. The lead lines of the thin film transistor layer TFTL may be disposed in the sub-area SBA.

The light emitting element layer EML may be disposed on the thin film transistor layer TFTL. The light emitting element layer EML may include multiple light emitting elements each including a first electrode, a second electrode, and a light emitting layer to emit light and a pixel defining film defining the pixels. The light emitting elements of the light emitting element layer EML may be disposed in the display area DA.

In an embodiment, the light emitting layer may be an organic light emitting layer including an organic material. The light emitting layer may include a hole transporting layer, an organic light emitting layer, and an electron transporting layer. In case that the first electrode receives a voltage through the thin film transistor of the thin film transistor layer TFTL and the second electrode receives a cathode voltage, holes and electrons may move to the organic light emitting layer through the hole transporting layer and the electron transporting layer, respectively, and may be combined with each other in the organic light emitting layer to emit light. In an embodiment, the light emitting element may include a quantum dot light emitting diode including a quantum dot light emitting layer, an inorganic light emitting diode including an inorganic semiconductor, or a micro light emitting diode.

The encapsulation layer TFEL may cover an upper surface and side surfaces of the light emitting element layer EML, and may protect the light emitting element layer EML. The encapsulation layer TFEL may include at least one inorganic film and at least one organic film for encapsulating the light emitting element layer EML.

The touch sensing layer TSU may be disposed on the encapsulation layer TFEL. The touch sensing layer TSU may include multiple touch electrodes for sensing a user's touch in a capacitance manner and touch lines connecting the touch electrodes and the touch driver 400 to each other. As an example, the touch sensing layer TSU may sense the user's touch using a mutual capacitance manner or a self-capacitance manner.

In an embodiment, the touch sensing layer TSU may be disposed on a separate substrate disposed on the display layer DU. The substrate supporting the touch sensing layer TSU may be a base member encapsulating the display layer DU.

The touch electrodes of the touch sensing layer TSU may be disposed in a touch sensor area overlapping the display area DA. The touch lines of the touch sensing layer TSU may be disposed in a touch peripheral area overlapping the non-display area NDA.

The color filter layer CFL may be disposed on the touch sensing layer TSU. The color filter layer CFL may include multiple color filters each corresponding to the emission areas. Each of the color filters may selectively transmit light of a specific wavelength therethrough and block or absorb light of other wavelengths. The color filter layer CFL may absorb some of light introduced from the outside of the display device 10 to reduce reflected light by external light. Accordingly, the color filter layer CFL may prevent distortion of colors due to external light reflection.

Since the color filter layer CFL may be directly disposed on the touch sensing layer TSU, the display device 10 may not require a separate substrate for the color filter layer CFL. Accordingly, a thickness of the display device 10 may be relatively small.

In some embodiments, the display device 10 may further include an optical device 500. The optical device 500 may be disposed in the second display area DA2 or the third display area DA3. The optical device 500 may emit or receive light of infrared, ultraviolet, and visible light bands. For example, the optical device 500 may be an optical sensor sensing light incident on the display device 10, such as a proximity sensor, an illuminance sensor, and a camera sensor, or an image sensor.

Figure 6:
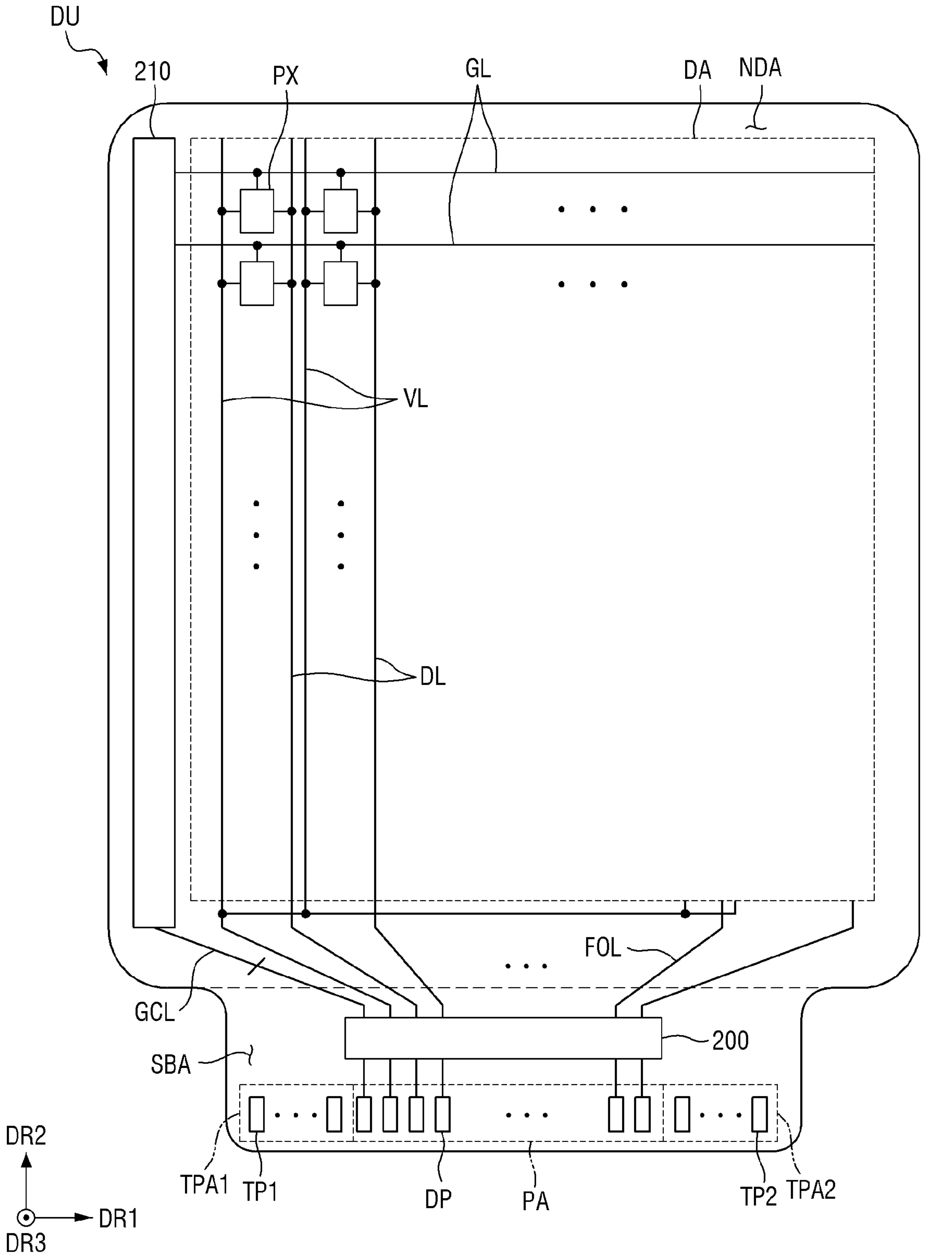
FIG. 6 is a plan view illustrating a display layer of the display device according to an embodiment.

FIG. 6 is a plan view illustrating a display layer of the display device according to an embodiment. Referring to FIG. 6, the display layer DU may include a display area DA and a non-display area NDA.

The display area DA may be disposed at the center of the display panel 100. Multiple pixels PX, multiple gate lines GL, multiple data lines DL, and multiple power lines VL may be disposed in the display area DA. Each of the pixels PX may be defined as a minimum part emitting light.

The gate lines GL may supply gate signals received from a gate driver 210 to the pixels PX. The gate lines GL may extend in the first direction DR1, and may be spaced apart from each other in the second direction DR2 crossing the first direction DR1.

The data lines DL may supply data voltages received from the display driver 200 to the pixels PX. The data lines DL may extend in the second direction DR2, and may be spaced apart from each other in the first direction DR1.

The power lines VL may supply a source voltage received from the display driver 200 to the pixels PX. Here, the source voltage may be at least one of a driving voltage, an initialization voltage, a reference voltage, and a low potential voltage. The power lines VL may extend in the second direction DR2, and may be spaced apart from each other in the first direction DR1.

The non-display area NDA may surround the display area DA. The gate driver 210, fan-out lines FOL, and gate control lines GCL may be disposed in the non-display area NDA. The gate driver 210 may generate multiple gate signals based on gate control signals, and may sequentially supply the gate signals to the gate lines GL according to a set order.

The fan-out lines FOL may extend from the display driver 200 to the display area DA. The fan-out lines FOL may supply the data voltages received from the display driver 200 to the data lines DL.

The gate control lines GCL may extend from the display driver 200 to the gate driver 210. The gate control lines GCL may supply the gate control signals received from the display driver 200 to the gate driver 210.

The sub-area SBA may include the display driver 200, a pad area PA, and first and second touch pad areas TPA1 and TPA2.

The display driver 200 may output signals and voltages for driving the display panel 100 to the fan-out lines FOL. The display driver 200 may supply the data voltages to the data lines DL through the fan-out lines FOL. The data voltages may be supplied to the pixels PX, and may control luminance of the pixels PX. The display driver 200 may supply the gate control signals to the gate driver 210 through the gate control lines GCL.

The pad area PA, the first touch pad area TPA1, and the second touch pad area TPA2 may be disposed at an edge of the sub-area SBA. The pad area PA, the first touch pad area TPA1, and the second touch pad area TPA2 may be electrically connected to the circuit board 300 using a material such as an anisotropic conductive film or a self assembly anisotropic conductive paste (SAP).

The pad area PA may include multiple display pad parts DP. The display pad parts DP may be electrically connected to a graphic system through the circuit board 300. The display pad parts DP may be electrically connected to the circuit board 300 to receive digital video data, and may supply the digital video data to the display driver 200.

Figure 7:
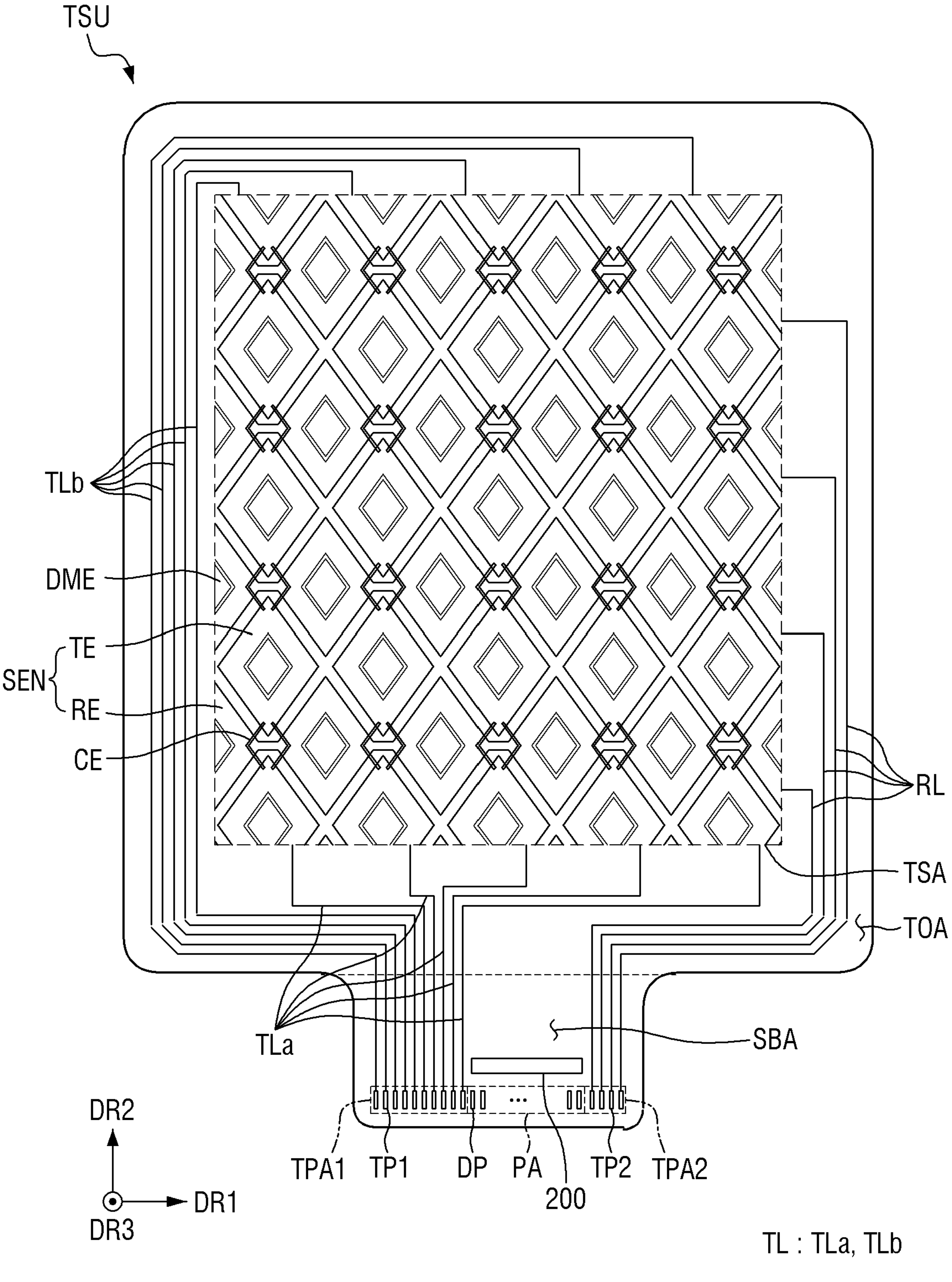
FIG. 7 is a plan view illustrating a touch sensing layer of the display device according to an embodiment.

FIG. 7 is a plan view illustrating a touch sensing layer of the display device according to an embodiment. Referring to FIG. 7, the touch sensing layer TSU may include a touch sensor area TSA sensing a user's touch and a touch peripheral area TOA disposed around the touch sensor area TSA. The touch sensor area TSA may be disposed in the display area DA of the display device 10, and the touch peripheral area TOA may be disposed in the non-display area NDA of the display device 10.

The touch sensor area TSA may include multiple touch electrodes SEN and multiple dummy electrodes DME. The touch electrodes SEN may form mutual capacitance or self-capacitance in order to sense a touch of an object or a person. The touch electrodes SEN may include multiple driving electrodes TE and multiple sensing electrodes RE.

The driving electrodes TE may be arranged in the first direction DR1 and the second direction DR2. The driving electrodes TE may be spaced apart from each other in the first direction DR1 and the second direction DR2. The driving electrodes TE adjacent to each other in the second direction DR2 may be electrically connected to each other through a bridge electrode CE.

The driving electrodes TE may be electrically connected to first touch pad parts TP1 through driving lines TDL. The driving lines TDL may include lower driving lines TLa and upper driving lines TLb. For example, the driving electrodes TE disposed on the lower side of the touch sensor area TSA may be electrically connected to the first touch pad parts TP1 through the lower driving lines TLa, and the driving electrodes TE disposed on the upper side of the touch sensor area TSA may be electrically connected to the first touch pad parts TP1 through the upper driving lines TLb. The lower driving lines TLa may extend to the first touch pad parts TP1 via the lower side of the touch peripheral area TOA. The upper driving lines TLb may extend to the first touch pad parts TP1 via the upper, left, and lower sides of the touch peripheral area TOA. The first touch pad parts TP1 may be electrically connected to the touch driver 400 through the circuit board 300.

The bridge electrode CE may be bent at least once. For example, the bridge electrode CE may have a clamp shape ("<" or ">"), but a shape of the bridge electrode CE in a plan view may not be limited thereto. The driving electrodes TE adjacent to each other in the second direction DR2 may be electrically connected to each other by multiple bridge electrodes CE, and even though one of the bridge electrodes CE may be disconnected, the driving electrodes TE may be stably electrically connected to each other through the other bridge electrodes CE. The driving electrodes TE adjacent to each other may be electrically connected to each other by two bridge electrodes CE, but the number of bridge electrodes CE may not be limited thereto.

The bridge electrodes CE may be disposed at a different layer from the driving electrodes TE and the sensing electrodes RE. The sensing electrodes RE adjacent to each other in the first direction DR1 may be electrically connected through connection parts disposed at a same layer as the driving electrodes TE or the sensing electrodes RE, and the driving electrodes TE adjacent to each other in the second direction DR2 may be electrically connected through the bridge electrodes CE disposed at a different layer from the driving electrodes TE or the sensing electrodes RE. Accordingly, even though the bridge electrodes CE overlap the sensing electrodes RE in a Z-axis direction, the driving electrodes TE and the sensing electrodes RE may be insulated from each other. Mutual capacitance may be formed between the driving electrodes TE and the sensing electrodes RE.

The sensing electrodes RE may extend in the first direction DR1 and may be spaced apart from each other in the second direction DR2. The sensing electrodes RE may be arranged in the first direction DR1 and the second direction DR2, and the sensing electrodes RE adjacent to each other in the first direction DR1 may be electrically connected to each other through the connection parts.

The sensing electrodes RE may be electrically connected to second touch pad parts TP2 through sensing lines RL. For example, the sensing electrodes RE disposed on the right side of the touch sensor area TSA may be electrically connected to the second touch pad parts TP2 through the sensing lines RL. The sensing lines RL may extend to the second touch pad parts TP2 via the right side and the lower side of the touch peripheral area TOA. The second touch pad parts TP2 may be electrically connected to the touch driver 400 through the circuit board 300.

Each of the dummy electrodes DME may be surrounded by the driving electrode TE or the sensing electrode RE. Each of the dummy electrodes DME may be spaced apart and insulated from the driving electrode TE or the sensing electrode RE. Accordingly, the dummy electrodes DME may be electrically floated.

The pad area PA, the first touch pad area TPA1, and the second touch pad area TPA2 may be disposed at an edge of the sub-area SBA. The pad area PA, the first touch pad area TPA1, and the second touch pad area TPA2 may be electrically connected to the circuit board 300 using a low-resistance and high-reliability material such as an anisotropic conductive film or a self assembly anisotropic conductive paste (SAP).

The first touch pad area TPA1 may be disposed on one side of the pad area PA, and may include multiple first touch pad parts TP1. The first touch pad parts TP1 may be electrically connected to the touch driver 400 disposed on the circuit board 300. The first touch pad parts TP1 may supply touch driving signals to the driving electrodes TE through multiple driving lines TDL.

The second touch pad area TPA2 may be disposed on another side of the pad area PA, and may include multiple second touch pad parts TP2. The second touch pad parts TP2 may be electrically connected to the touch driver 400 disposed on the circuit board 300. The touch driver 400 may receive touch sensing signals through multiple sensing lines RL electrically connected to the second touch pad parts TP2, and may sense changes in mutual capacitance between the driving electrodes TE and the sensing electrodes RE.

In an embodiment, the touch driver 400 may supply a touch driving signal to each of the driving electrodes TE and the sensing electrodes RE, and may receive a touch sensing signal from each of the driving electrodes TE and the sensing electrodes RE. The touch driver 400 may sense a change in charge of each of the driving electrodes TE and the sensing electrodes RE based on the touch sensing signal.

Figure 8:
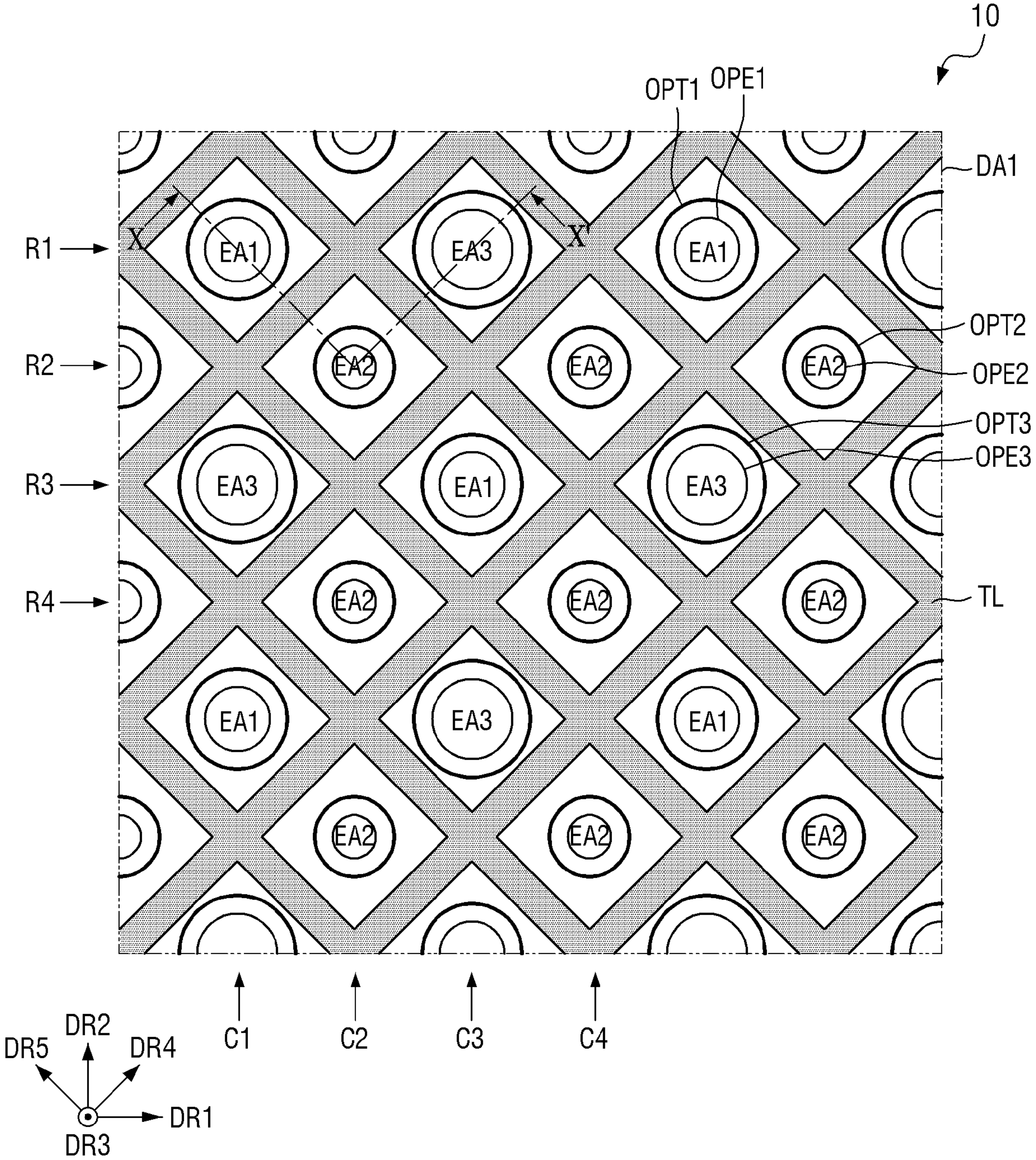
FIG. 8 is a plan view illustrating an arrangement of multiple emission areas in a first display area of the display device according to an embodiment.
Figure 9:
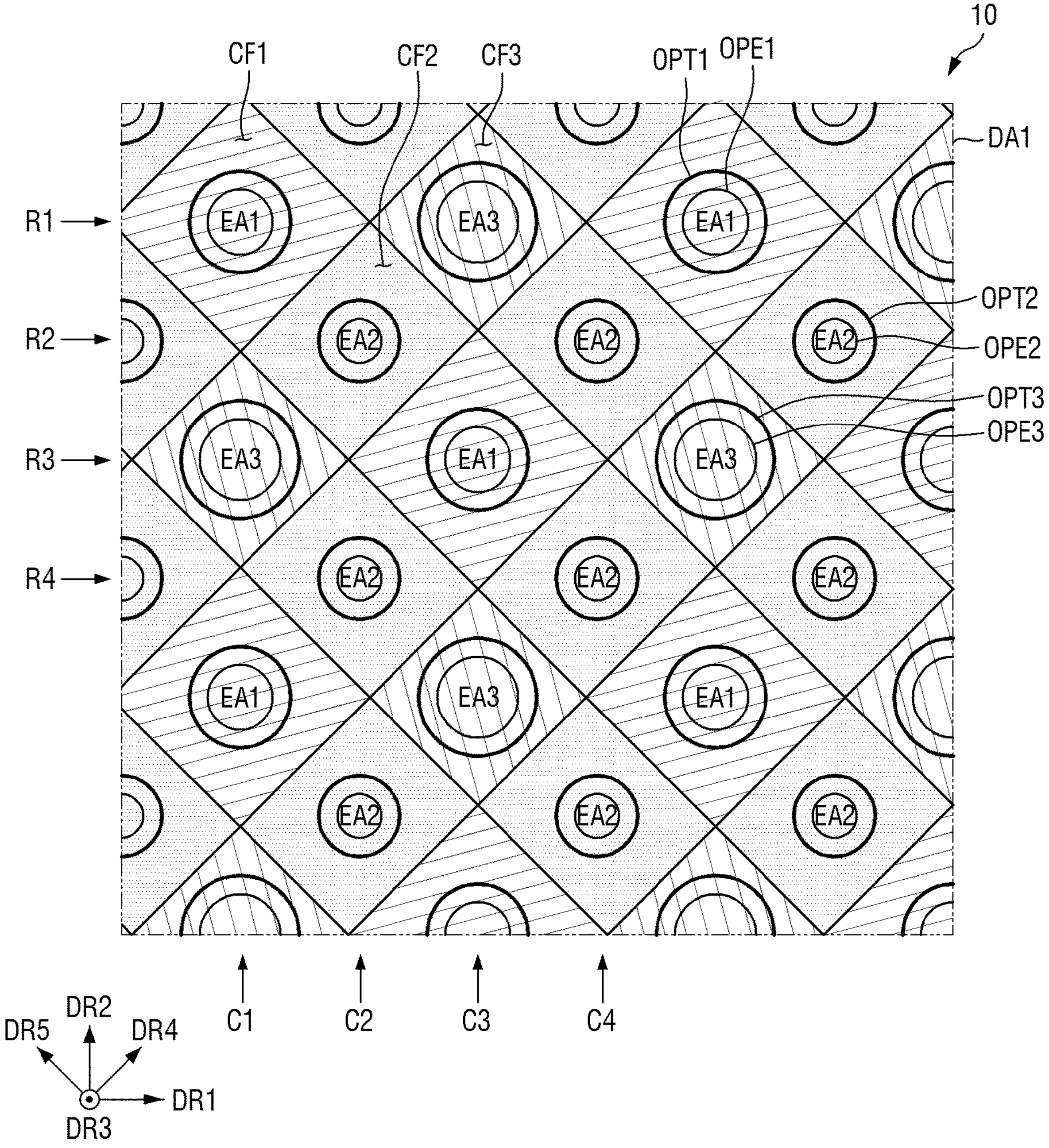
FIG. 9 is a plan view illustrating an arrangement of multiple color filters disposed in the first display area of FIG. 8.

FIG. 8 is a plan view illustrating an arrangement of emission areas in a first display area of the display device according to an embodiment, and FIG. 9 is a plan view illustrating an arrangement of color filters disposed in the first display area of FIG. 8. Referring to FIGS. 8 and 9, the display device 10 may include multiple emission areas EA1, EA2, and EA3 disposed in the display area DA. The display area DA illustrated in FIGS. 8 and 9 may be the first display area DA1, and the emission areas EA1, EA2, and EA3 may be disposed in the first display area DA1. However, as described later, the emission areas EA1, EA2, and EA3 may also be disposed in the second display area DA2 and the third display area DA3 of the display area DA.

The emission areas EA1, EA2, and EA3 may include first emission areas EA1, second emission areas EA2, and third emission areas EA3 that emit light of different colors. The first to third emission areas EA1, EA2, and EA3 may emit red, green, or blue light, respectively, and colors of the light emitted from the respective emission areas EA1, EA2, and EA3 may be different depending on a type of light emitting element ED (see FIG. 10) disposed in a light emitting element layer EML to be described later. In an embodiment, the first emission area EA1 may emit first light, which may be red light, the second emission area EA2 may emit second light, which may be green light, and the third emission area EA3 may emit third light, which may be blue light. However, the disclosure may not be limited thereto.

The emission areas EA1, EA2, and EA3 may be disposed in a PenTile™ type, for example, a diamond PenTile™ type. For example, the first emission areas EA1 and the third emission areas EA3 may be disposed to be spaced apart from each other in the first direction DR1, and may be alternately disposed in the first direction DR1 and the second direction DR2. In an arrangement of the emission areas EA1, EA2, and EA3, the first emission areas EA1 and the third emission areas EA3 may be alternately disposed in the first direction DR1 in a first row R1 and a third row R3. The first emission areas EA1 and the third emission areas EA3 may be alternately disposed in the second direction DR2 in a first column C1 and a third column C3.

The second emission areas EA2 may be spaced apart from other adjacent second emission areas EA2 in the first direction DR1 and the second direction DR2, and may be spaced apart from adjacent first emission areas EA1 and third emission areas EA3 in a fourth direction DR4 or a fifth direction DR5. Multiple second emission areas EA2 may be repeatedly disposed along the first direction DR1 and the second direction DR2, and the second emission areas EA2 and the first emission areas EA1 or the second emission areas EA2 and the third emission areas EA3 may be alternately disposed along the fourth direction DR4 or the fifth direction DR5. In the arrangement of the emission areas EA1, EA2, and EA3, the second emission areas EA2 may be repeatedly disposed in the first direction DR1 in a second row R2 and a fourth row R4, and the second emission areas EA2 may be repeatedly disposed in the second direction DR2 in a second column C2 and a fourth column C4.

The first to third emission areas EA1, EA2, and EA3 may be defined, respectively, by multiple openings OPE1, OPE2, and OPE3 formed in a pixel defining film PDL (see FIG. 10) of a light emitting element layer EML to be described later. For example, the first emission area EA1 may be defined by a first opening OPE1 of the pixel defining film, the second emission area EA2 may be defined by a second opening OPE2 of the pixel defining film, and the third emission area EA3 may be defined by a third opening OPE3 of the pixel defining film.

In an embodiment, areas or sizes of the first to third emission areas EA1, EA2, and EA3 may be different from each other. In an embodiment of FIG. 8, an area of the third emission area EA3 may be greater than areas of the first emission area EA1 and the second emission area EA2, and an area of the first emission area EA1 may be greater than an area of the second emission area EA2. Areas of the emission areas EA1, EA2, and EA3 may change depending on sizes of the openings OPE1, OPE2, and OPE3 formed in the pixel defining film PDL. An intensity of the light emitted from the emission areas EA1, EA2, and EA3 may change depending on the areas of the emission areas EA1, EA2, and EA3, and a color perception (or color vision or visual perception or color feeling) of a screen displayed on the display device 10 or the electronic device 1 may be controlled by adjusting the areas of the emission area EA1, EA2, and EA3. It has been illustrated in an embodiment of FIG. 8 that the third emission area EA3 has the greatest area, but the disclosure may not be limited thereto. The areas of the emission areas EA1, EA2, and EA3 may be freely adjusted according to a color perception of the screen required by the display device 10 and the electronic device 1. The areas of the emission areas EA1, EA2, and EA3 may be related to light efficiency, a lifespan of light emitting elements ED, and the like, and may have a trade-off relationship with external light reflection. The areas of the emission areas EA1, EA2, and EA3 may be adjusted in consideration of the above factors.

In the display device 10 having the arrangement of the emission areas EA1, EA2, and EA3 as illustrated in FIG. 8, one first emission area EA1, two second emission areas EA2, and one third emission area EA3 disposed adjacent to each other may form one pixel group. One pixel group may include the emission areas EA1, EA2, and EA3 emitting light of different colors to express a white gradation. However, the disclosure may not be limited thereto, and a combination of the emission areas EA1, EA2, and EA3 constituting one pixel group may be variously modified depending on an arrangement of the emission areas EA1, EA2, and EA3, colors of the light emitted by the emission areas EA1, EA2, and EA3, and the like.

The display device 10 may include multiple color filters CF1, CF2, and CF3 disposed on the emission areas EA1, EA2, and EA3. The color filters CF1, CF2, and CF3 may be disposed to correspond to the emission areas EA1, EA2, and EA3, respectively. For example, the color filters CF1, CF2, and CF3 may be disposed on a light blocking layer BM (see FIG. 10) including multiple holes OPT1, OPT2, and OPT3 disposed to correspond to the emission areas EA1, EA2, and EA3, or the openings OPE1, OPE2, and OPE3. The holes OPT1, OPT2, and OPT3 of the light blocking layer may be formed to overlap the openings OPE1, OPE2, and OPE3, and may form light emitting areas through which the light emitted from the emission areas EA1, EA2, and EA3 may be emitted. Each of the color filters CF1, CF2, and CF3 may have a greater area than each of the holes OPT1, OPT2, and OPT3 of the light blocking layer and the openings OPE1, OPE2, and OPE3, and each of the color filters CF1, CF2, and CF3 may completely cover each of the light emitting area formed by the holes OPT1, OPT2, and OPT3.

The color filters CF1, CF2, and CF3 may include first color filters CF1, second color filters CF2, and third color filters CF3 disposed to correspond to different emission areas EA1, EA2, and EA3, respectively. The color filters CF1, CF2, and CF3 may include colorants such as dyes or pigments absorbing light of wavelength bands other than light of a specific wavelength band, and may be disposed to correspond to the colors of the light emitted from the emission areas EA1, EA2, and EA3. For example, the first color filter CF1 may be a red color filter disposed to overlap the first emission area EA1 and transmitting only the first light, which may be the red light, therethrough. The second color filter CF2 may be a green color filter disposed to overlap the second emission area EA2 and transmitting only the second light, which may be the green light, therethrough, and the third color filter CF3 may be a blue color filter disposed to overlap the third emission area EA3 and transmitting only the third light, which may be the blue light, therethrough.

Similar to the layout of the emission areas EA1, EA2, and EA3, the color filters CF1, CF2, and CF3 may be disposed in a PenTile™ type, for example, a diamond PenTile™ type. For example, the first color filters CF1 and the third color filters CF3 may be alternately disposed in the first direction DR1 and the second direction DR2. In an arrangement of the color filters CF1, CF2, and CF3, the first color filters CF1 and the third color filters CF3 may be alternately disposed in the first direction DR1 in the first row R1 and the third row R3. The first color filters CF1 and the third color filters CF3 may be alternately disposed in the second direction DR2 in the first column C1 and the third column C3.

The second color filters CF2 may be spaced apart from other adjacent second color filters CF2 in the first direction DR1 and the second direction DR2, and may be spaced apart from adjacent first color filters CF1 and third color filters CF3 in the fourth direction DR4 or the fifth direction DR5. Multiple second color filters CF2 may be repeatedly disposed along the first direction DR1 and the second direction DR2, and the second color filters CF2 and the first color filters CF1 or the second color filters CF2 and the third color filters CF3 may be alternately disposed along the fourth direction DR4 or the fifth direction DR5. In the arrangement of the color filters CF1, CF2, and CF3, the second color filters CF2 may be repeatedly disposed in the first direction DR1 in the second row R2 and the fourth row R4, and the second color filters CF2 may be repeatedly disposed in the second direction DR2 in the second column C2 and the fourth column C4.

According to an embodiment, areas of the color filters CF1, CF2, and CF3 in a plan view may be different from each other. For example, an area of the first color filter CF1, which may be the red color filter, may be greater than areas of the second color filter CF2, which may be the green color filter, and the third color filter CF3, which may be the blue color filter. An area of the third color filter CF3 may be greater than an area of the second color filter CF2. The color filters CF1, CF2, and CF3 may include sides extending in the fourth direction DR4 and the fifth direction DR5 and have quadrangular shapes, rectangular shapes, or rhombic shapes. The first color filters CF1 and the third color filters CF3 may include sides extending at the same length in the fourth direction DR4 and the fifth direction DR5, and have square shapes or rhombic shapes in a plan view. An area of the first color filter CF1 in a plan view may be greater than an area of the third color filter CF3, and the second color filters CF2 adjacent to the first color filters CF1 and the third color filters CF3 may include sides extending at different lengths in the fourth direction DR4 and the fifth direction DR5 and have rectangular shapes in a plan view.

In other words, the first color filters CF1 and the third color filters CF3 include the sides extending at the same length, and accordingly, may have shapes unrelated to their locations, but the second color filters CF2 include the sides extending at different lengths, and accordingly, directions in which long sides of the second color filters CF2 extend may be different from each other according to locations of the second color filters CF2. Shapes of the second color filters CF2 illustrated in FIG. 9 will be described by way of example. A second color filter CF2 disposed in the second column C2 of the second row R2 may have a shape in which long sides thereof extend in the fourth direction DR4, and a second color filter CF2 disposed in the fourth column C4 of the second row R2 may have a shape in which long sides thereof extend in the fifth direction DR5. In the display device 10 according to an embodiment, shapes and areas of the color filters CF1, CF2, and CF3 in a plan view may be designed so that external light of the display device 10 has a specific color perception.

In an embodiment, an area ratio of the first color filter CF1 and the second color filter CF2 in a plan view may be in the range of about 1:0.3 to about 1:0.7, and an area ratio of the first color filter CF1 and the third color filter CF3 in a plan view may be in the range of about 1:0.4 to about 1:1. As an example, an area ratio of the first color filter CF1, the second color filter CF2, and the third color filter CF3 may be about 1:0.59:0.52 or about 1:0.59:1. However, the area ratio of the color filters CF1, CF2, and CF3 may not be limited to that described above, and the areas of the color filters CF1, CF2, and CF3 in a plan view may be designed differently so that a color perception of reflected light in the display device 10 and the electronic device 1 has desired color coordinates.

The display device 10 includes the color filters CF1, CF2, and CF3 disposed on the display layer DU, such that an intensity of reflected external light may be reduced. Furthermore, the color perception of the reflected external light may be controlled by adjusting an arrangement, shapes, areas, and the like, of the color filters CF1, CF2, and CF3 in a plan view. A detailed description thereof will be provided later with reference to other drawings.

A touch electrode TL may be disposed between the emission areas EA1, EA2, and EA3. The touch electrode TL may be disposed to extend in the fourth direction DR4 and the fifth direction DR5, and may not overlap and be spaced apart from the emission areas EA1, EA2, and EA3. The touch electrode TL may be disposed to overlap a pixel defining film PDL (see FIG. 10) including the openings OPE1, OPE2, and OPE3 and a light blocking layer BM (see FIG. 10) including multiple holes OPT1, OPT2, and OPT3 to be described later. Although the touch electrode TL has been briefly illustrated in FIG. 8, the touch electrode TL may be either the touch driving electrode TE or the sensing electrode RE of FIG. 7.

Diameters of the openings OPE1, OPE2, and OPE3 forming the emission areas EA1, EA2, and EA3 may be smaller than diameters of holes OPT1, OPT2, and OPT3 of a light blocking layer BM to be described later. Opening intervals between the openings OPE1, OPE2, and OPE3 and the holes OPT1, OPT2, and OPT3 of the light blocking layer BM may be defined for each of the emission areas EA1, EA2, and EA3. The opening intervals may be defined as differences in diameter between the openings OPE1, OPE2, and OPE3 of the pixel defining film PDL and the holes OPT1, OPT2, and OPT3 of the light blocking layer BM. The opening intervals between the openings OPE1, OPE2, and OPE3 of different emission areas EA1, EA2, and EA3 and the holes OPT1, OPT2, and OPT3 of the light blocking layer BM may be different from each other. However, the disclosure may not be limited thereto. The opening intervals between the openings OPE1, OPE2, and OPE3 of different emission areas EA1, EA2, and EA3 and the holes OPT1, OPT2, and OPT3 of the light blocking layer BM may also be the same as each other.

Figure 10:
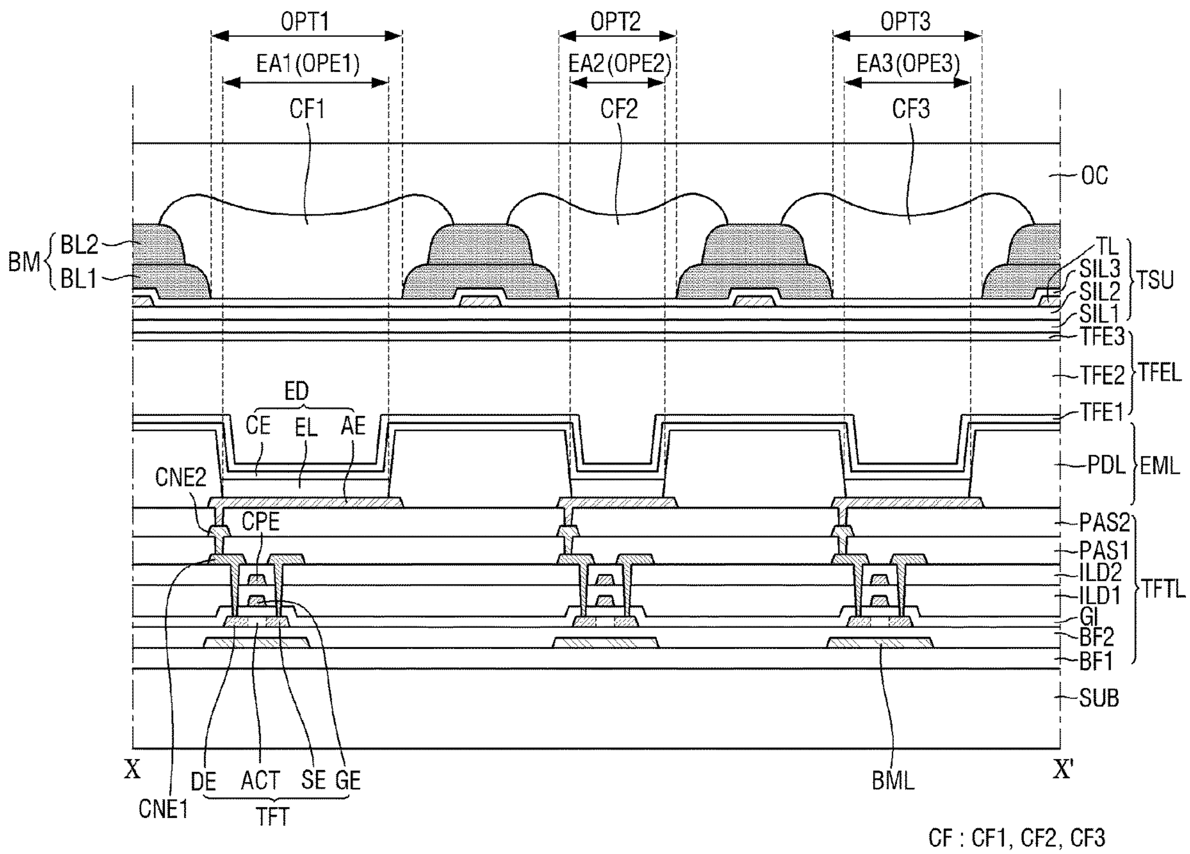
FIG. 10 is a schematic cross-sectional view taken along line X-X' of FIG. 8.

FIG. 10 is a schematic cross-sectional view taken along line X-X' of FIG. 8. FIG. 10 illustrates a schematic cross-section crossing the first emission area EA1, the second emission area EA2, and the third emission area EA3. A cross-sectional structure of the display device 10 will be described with reference to FIG. 10 in addition to FIGS. 8 and 9. The display panel 100 of the display device 10 may include a display layer DU, a touch sensing layer TSU, and a color filter layer CFL. The display layer DU may include a substrate SUB, a thin film transistor layer TFTL, a light emitting element layer EML, and an encapsulation layer TFEL. The display panel 100 may include a light blocking layer BM disposed on the touch sensing layer TSU, and color filters CF1, CF2, and CF3 of the color filter layer CFL may be disposed on the light blocking layer BM.

The substrate SUB may be a base substrate or a base member. The substrate SUB may be a flexible substrate that may be bent, folded, and rolled. As an example, the substrate SUB may include a polymer resin such as polyimide (PI), but may not be limited thereto. As an example, the substrate SUB may include a glass material, a metal material, or a combination thereof.

The thin film transistor layer TFTL may include a first buffer layer BF1, a lower metal layer BML, a second buffer layer BF2, thin film transistors TFT, a gate insulating layer GI, a first interlayer insulating layer ILD1, capacitor electrodes CPE, a second interlayer insulating layer ILD2, first connection electrodes CNE1, a first passivation layer PAS1, second connection electrodes CNE2, and a second passivation layer PAS2.

The first buffer layer BF1 may be disposed on the substrate SUB. The first buffer layer BF1 may include an inorganic film capable of preventing permeation of air or moisture. For example, the first buffer layer BF1 may include multiple inorganic films that may be alternately stacked on each other.

The lower metal layer BML may be disposed on the first buffer layer BF1. For example, the lower metal layer BML may be formed as a single layer or multiple layers made of any one of molybdenum (Mo), aluminum (Al), chromium (Cr), gold (Au), titanium (Ti), nickel (Ni), neodymium (Nd), and copper (Cu), alloys thereof, or a combination thereof.

The second buffer layer BF2 may cover the first buffer layer BF1 and the lower metal layer BML. The second buffer layer BF2 may include an inorganic film capable of preventing permeation of air or moisture. For example, the second buffer layer BF2 may include multiple inorganic films that may be alternately stacked on each other.

The thin film transistor TFT may be disposed on the second buffer layer BF2, and may constitute a pixel circuit of each of the pixels. For example, the thin film transistor TFT may be a driving transistor or a switching transistor of the pixel circuit. The thin film transistor TFT may include a semiconductor layer ACT, a source electrode SE, a drain electrode DE, and a gate electrode GE.

The semiconductor layer ACT may be disposed on the second buffer layer BF2. The semiconductor layer ACT may overlap the lower metal layer BML and the gate electrode GE in the thickness direction, and may be insulated from the gate electrode GE by the gate insulating layer GI. A material of the semiconductor layer ACT in portions of the semiconductor layer ACT may become conductors to form the source electrode SE and the drain electrode DE.

The gate electrode GE may be disposed on the gate insulating layer GI. The gate electrode GE may overlap the semiconductor layer ACT with the gate insulating layer GI interposed therebetween.

The gate insulating layer GI may be disposed on the semiconductor layer ACT. For example, the gate insulating layer GI may cover the semiconductor layer ACT and the second buffer layer BF2, and may insulate the semiconductor layer ACT and the gate electrode GE from each other. The gate insulating layer GI may include a contact hole through which the first connection electrode CNE1 penetrates.

The first interlayer insulating layer ILD1 may cover the gate electrode GE and the gate insulating layer GI. The first interlayer insulating layer ILD1 may include a contact hole through which the first connection electrode CNE1 penetrates. The contact hole of the first interlayer insulating layer ILD1 may be electrically connected to the contact hole of the gate insulating layer GI and a contact hole of the second interlayer insulating layer ILD2.

The capacitor electrode CPE may be disposed on the first interlayer insulating layer ILD1. The capacitor electrode CPE may overlap the gate electrode GE in the thickness direction. The capacitor electrode CPE and the gate electrode GE may form capacitance.

The second interlayer insulating layer ILD2 may cover the capacitor electrode CPE and the first interlayer insulating layer ILD1. The second interlayer insulating layer ILD2 may include a contact hole through which the first connection electrode CNE1 penetrates. The contact hole of the second interlayer insulating layer ILD2 may be electrically connected to the contact hole of the first interlayer insulating layer ILD1 and the contact hole of the gate insulating layer GI.

The first connection electrode CNE1 may be disposed on the second interlayer insulating layer ILD2. The first connection electrode CNE1 may electrically connect the drain electrode DE of the thin film transistor TFT and the second connection electrode CNE2 to each other. The first connection electrode CNE1 may be inserted into the contact holes formed in the second interlayer insulating layer ILD2, the first interlayer insulating layer ILD1, and the gate insulating layer GI to be in contact with the drain electrode DE of the thin film transistor TFT.

The first passivation layer PAS1 may cover the first connection electrode CNE1 and the second interlayer insulating layer ILD2. The first passivation layer PAS1 may protect the thin film transistor TFT. The first passivation layer PAS1 may include a contact hole through which the second connection electrode CNE2 penetrates.

The second connection electrode CNE2 may be disposed on the first passivation layer PAS1. The second connection electrode CNE2 may electrically connect the first connection electrode CNE1 and a pixel electrode AE of a light emitting element ED to each other. The second connection electrode CNE2 may be inserted into the contact hole formed in the first passivation layer PAS1 to be in contact with the first connection electrode CNE1.

The second passivation layer PAS2 may cover the second connection electrode CNE2 and the first passivation layer PAS1. The second passivation layer PAS2 may include a contact hole through which the pixel electrode AE of the light emitting element ED penetrates.

The light emitting element layer EML may be disposed on the thin film transistor layer TFTL. The light emitting element layer EML may include light emitting elements ED and a pixel defining film PDL. The light emitting element ED may include the pixel electrode AE, a light emitting layer EL, and a common electrode CE.

The pixel electrode AE may be disposed on the second passivation layer PAS2. The pixel electrode AE may be disposed to overlap any one of the openings OPE1, OPE2, and OPE3 of the pixel defining film PDL. The pixel electrode AE may be electrically connected to the drain electrode DE of the thin film transistor TFT through the first and second connection electrodes CNE1 and CNE2.

The light emitting layer EL may be disposed on the pixel electrode AE. For example, the light emitting layer EL may be an organic light emitting layer made of an organic material, but may not be limited thereto. In a case where the light emitting layer EL is the organic light emitting layer, in case that the thin film transistor TFT applies a voltage (e.g., predetermined or selectable voltage) to the pixel electrode AE of the light emitting element ED and the common electrode CE of the light emitting element ED receives a common voltage or a cathode voltage, holes and electrons may move to the light emitting layer EL through a hole transporting layer and an electron transporting layer, respectively, and may be combined with each other in the light emitting layer EL to emit light.

The common electrode CE may be disposed on the light emitting layer EL. For example, the common electrode CE may not be divided for each of the pixels, and may be implemented in the form of an electrode common to all the pixels. The common electrode CE may be disposed on the light emitting layers EL in the first to third emission areas EA1, EA2, and EA3, and may be disposed on the pixel defining film PDL in an area other than the first to third emission areas EA1, EA2, and EA3.

The common electrode CE may receive the common voltage or a low potential voltage. In case that the pixel electrode AE receives a voltage corresponding to a data voltage and the common electrode CE receives the low potential voltage, a potential difference may be formed between the pixel electrode AE and the common electrode CE, such that the light emitting layer EL may emit light.

The pixel defining film PDL may include the openings OPE1, OPE2, and OPE3, and may be disposed on the second passivation layer PAS2 and portions of the pixel electrodes AE. The pixel defining film PDL may include the first opening OPE1, the second opening OPE2, and the third opening OPE3, and the respective openings OPE1, OPE2, and OPE3 may expose portions of the pixel electrode AE. As described above, the openings OPE1, OPE2, and OPE3 of the pixel defining film PDL may define the first to third emission areas EA1, EA2, and EA3, respectively, and may have different areas or sizes. The pixel defining film PDL may space and insulate the pixel electrodes AE of multiple light emitting elements ED from each other. The pixel defining film PDL may include a light absorbing material to prevent light reflection. For example, the pixel defining film PDL may include a polyimide (PI)-based binder and a pigment in which red, green, and blue may be mixed with each other. The pixel defining film PDL may instead include a cardo-based binder resin and a mixture of a lactam black pigment and a blue pigment. The pixel defining film PDL may instead include carbon black.

The encapsulation layer TFEL may be disposed on the common electrodes CE to cover the light emitting elements ED. The encapsulation layer TFEL may include at least one inorganic film to prevent oxygen or moisture from permeating into the light emitting element layer EML. The encapsulation layer TFE may include at least one organic film to protect the light emitting element layer EML from foreign substances such as dust.

In an embodiment, the encapsulation layer TFEL may include a first encapsulation layer TFE1, a second encapsulation layer TFE2, and a third encapsulation layer TFE3. The first encapsulation layer TFE1 and the third encapsulation layer TFE3 may be inorganic encapsulation layers, and the second encapsulation layer TFE2 disposed between the first encapsulation layer TFE1 and the third encapsulation layer TFE3 may be an organic encapsulation layer.

Each of the first encapsulation layer TFE1 and the third encapsulation layer TFE3 may include one or more inorganic insulating materials. The inorganic insulating material may include aluminum oxide, titanium oxide, tantalum oxide, hafnium oxide, zinc oxide, silicon oxide, silicon nitride, silicon oxynitride, or a combination thereof.

The second encapsulation layer TFE2 may include a polymer-based material. The polymer-based material may include an acrylic resin, an epoxy-based resin, polyimide, polyethylene, the like, or a combination thereof. For example, the second encapsulation layer TFE2 may include an acrylic resin such as polymethyl methacrylate, polyacrylic acid, or both. The second encapsulation layer TFE2 may be formed by curing a monomer or applying a polymer.

The touch sensing layer TSU may be disposed on the encapsulation layer TFEL. The touch sensing layer TSU may include a first touch insulating layer SIL1, a second touch insulating layer SIL2, touch electrodes TL, and a third touch insulating layer SIL3. The first touch insulating layer SIL1 may be disposed on the encapsulation layer TFEL. The first touch insulating layer SIL1 may have insulating and optical functions. The first touch insulating layer SIL1 may include at least one inorganic film. Optionally, the first touch insulating layer SIL1 may be omitted.

The second touch insulating layer SIL2 may cover the first touch insulating layer SIL1. Although not illustrated FIG. 10, touch electrodes of another layer may be further disposed on the first touch insulating layer SIL1, and the second touch insulating layer SIL2 may cover such touch electrodes TL. The second touch insulating layer SIL2 may have insulating and optical functions. For example, the second touch insulating layer SIL2 may be an inorganic film including at least one of a silicon nitride layer, a silicon oxynitride layer, a silicon oxide layer, a titanium oxide layer, and an aluminum oxide layer.

Some of the touch electrodes TL may be disposed on the second touch insulating layer SIL2. Each of the touch electrodes TL may not overlap the first to third emission areas EA1, EA2, and EA3. Each of the touch electrodes TL may be formed as a single layer made of molybdenum (Mo), titanium (Ti), copper (Cu), aluminum (Al), indium tin oxide (ITO), or a combination thereof, or be formed as a stacked structure (Ti/Al/Ti) of aluminum and titanium, a stacked structure (ITO/Al/ITO) of aluminum and ITO, an APC alloy, and a stacked structure (ITO/APC/ITO) of an APC alloy and ITO.

The touch electrode TL of the touch sensing layer TSU may have a line width (e.g., predetermined or selectable line width) and may be disposed to overlap a light blocking layer BM to be described later. The light blocking layer BM may have a width enough to completely cover the touch electrode TL, and an interval CT (FIG. 12) between an edge of the light blocking layer BM and the touch electrode TL may be defined. In an embodiment, the line width of the touch electrode TL may be in the range of about 4 μm to about 6 μm, and the interval CT between the touch electrode TL and the edge of the light blocking layer BM may be in the range of about 5 μm to about 7 μm. The touch electrode TL may be disposed so that a central portion thereof may be substantially parallel to a central portion of the light blocking layer BM, and the interval CT from both sides of the touch electrode TL to the edge of the light blocking layer BM may be substantially constant.

The third touch insulating layer SIL3 may cover the touch electrodes TL and the second touch insulating layer SIL2. The third touch insulating layer SIL3 may have insulating and optical functions. The third touch insulating layer SIL3 may be made of the material exemplified in the second touch insulating layer SIL2.

The light blocking layer BM may be disposed on the third touch insulating layer SIL3 of the touch sensing layer TSU. The light blocking layer BM may be disposed to cover conductive lines of the touch electrodes TL, and may include multiple holes OPT1, OPT2, and OPT3 disposed to overlap the emission areas EA1, EA2, and EA3. For example, a first hole OPT1 may be disposed to overlap the first emission area EA1 or the first opening OPE1. A second hole OPT2 may be disposed to overlap the second emission area EA2 or the second opening OPE2, and a third hole OPT3 may be disposed to overlap the third emission area EA3 or the third opening OPE3. Areas or sizes of the respective holes OPT1, OPT2, and OPT3 may be greater than the areas or sizes of the openings OPE1, OPE2, and OPE3 of the pixel defining film PDL. The holes OPT1, OPT2, and OPT3 of the light blocking layer BM may be formed to be greater than the openings OPE1, OPE2, and OPE3 of the pixel defining film PDL, and accordingly, the light emitted from the emission areas EA1, EA2, and EA3 may be viewed by a user not only from a front surface of the display device 10 but also from side surfaces of the display device 10.

The light blocking layer BM may include a light absorbing material. For example, the light blocking layer BM may include an inorganic black pigment or an organic black pigment. The inorganic black pigment may be carbon black, and the organic black pigment may include at least one of lactam black, perylene black, and aniline black, but the disclosure may not be limited thereto. The light blocking layer BM may prevent color mixing due to permeation of visible light between the first to third emission areas EA1, EA2, and EA3 to improve a color gamut of the display device 10.

The color filters CF1, CF2, and CF3 of the color filter layer CFL may be disposed on the light blocking layer BM. The different color filters CF1, CF2, and CF3 may be disposed to correspond to the different emission areas EA1, EA2, and EA3 or openings OPE1, OPE2, and OPE3 of pixel defining film PDL and the holes OPT1, OPT2, and OPT3 of the light blocking layer BM, respectively. For example, the first color filter CF1 may be disposed to correspond to the first emission area EA1, the second color filter CF2 may be disposed to correspond to the second emission area EA2, and the third color filter CF3 may be disposed to correspond to the third emission area EA3. The first color filter CF1 may be disposed in the first hole OPT1 of the light blocking layer BM, the second color filter CF2 may be disposed in the second hole OPT2 of the light blocking layer BM, and the third color filter CF3 may be disposed in the third hole OPT3 of the light blocking layer BM. Each of the color filters CF1, CF2, and CF3 may be disposed to have a greater area than each of the holes OPT1, OPT2, and OPT3 of the light blocking layer BM in a plan view, and portions of each of the color filters CF1, CF2, and CF3 may be directly disposed on the light blocking layer BM.

Figure 11:
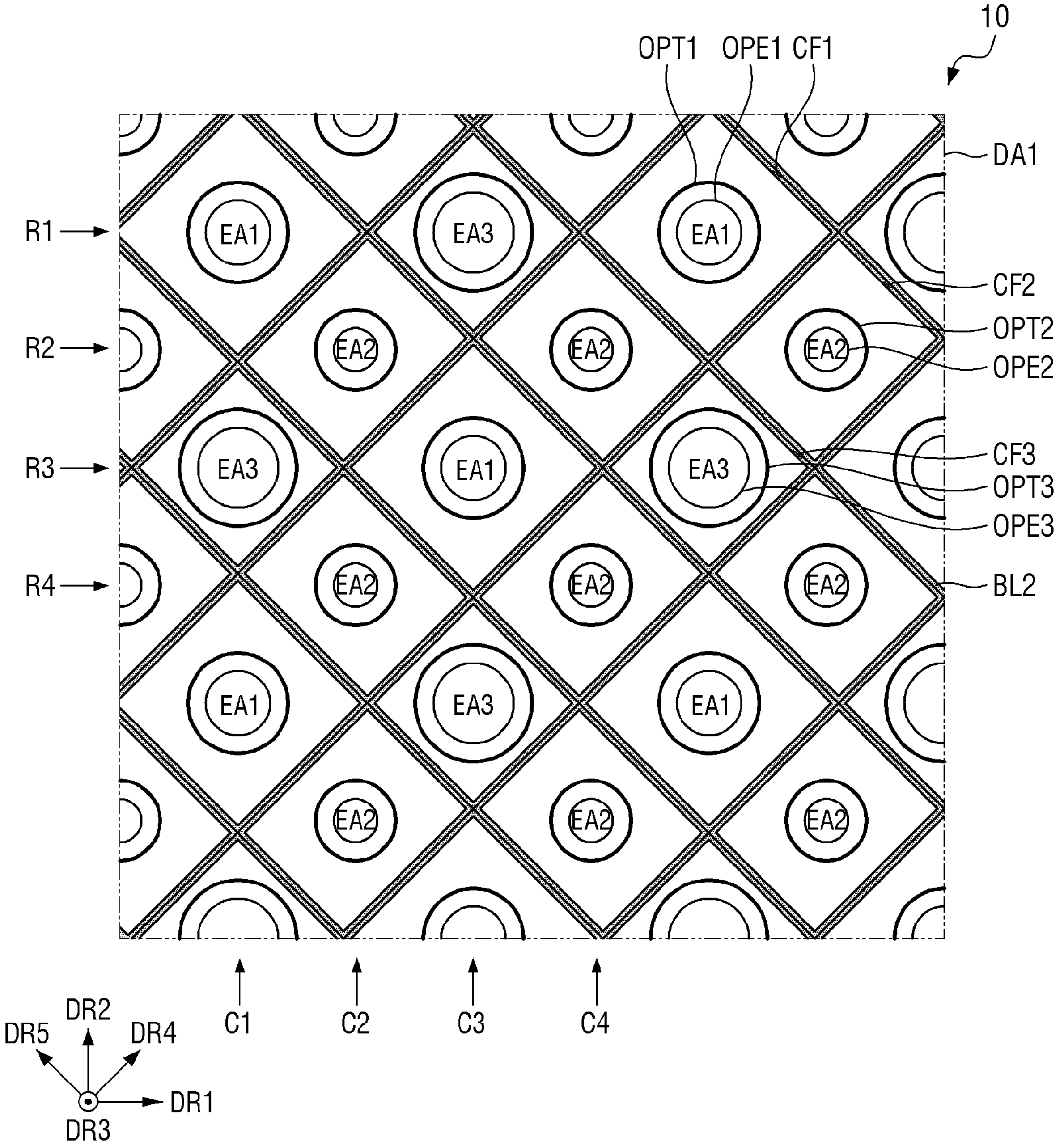
FIG. 11 is a view illustrating an arrangement in a plan view of a second light blocking layer disposed in the first display area of the display device according to an embodiment.
Figure 12:
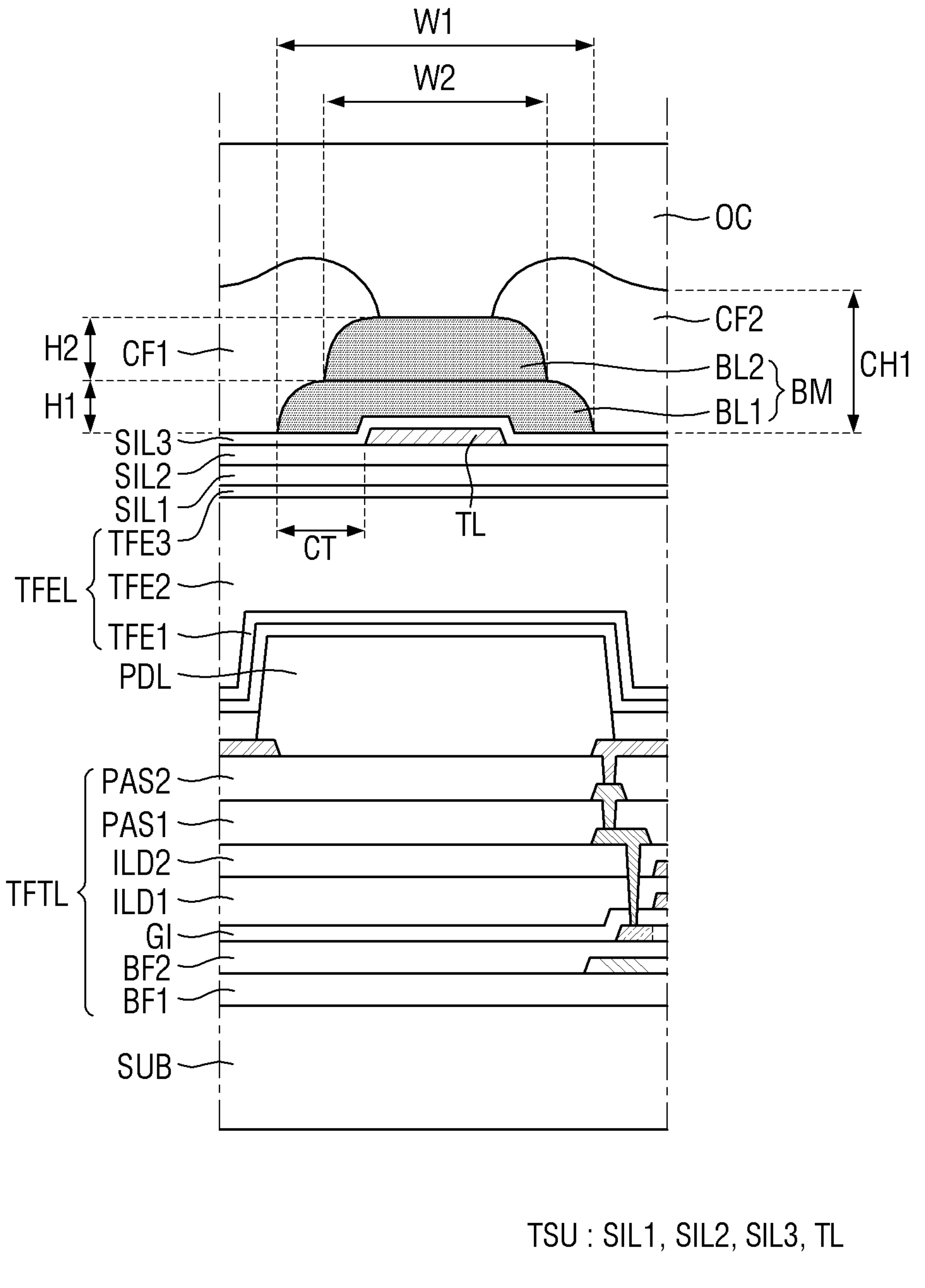
FIG. 12 is a schematic cross-sectional view illustrating a portion between a first emission area and a second emission area of FIG. 10.

FIG. 11 is a view illustrating an arrangement in a plan view of a second light blocking layer disposed in the first display area of the display device according to an embodiment, and FIG. 12 is a schematic cross-sectional view illustrating a portion between a first emission area and a second emission area of FIG. 10. Referring to FIGS. 11 and 12 in addition to FIG. 10, the light blocking layer BM according to an embodiment may include a first light blocking layer BL1 and a second light blocking layer BL2 disposed on the first light blocking layer BL1. The color filters CF1, CF2, and CF3 may be disposed to correspond respectively to the holes OPT1, OPT2, and OPT3 formed in the first light blocking layer BL1 of the light blocking layer BM, and portions of the color filters CF1, CF2, and CF3 may be directly disposed on the second light blocking layer BL2. Adjacent color filters CF1, CF2, and CF3 may be spaced apart from each other on the second light blocking layer BL2. In the first display area DA1, portions of the light blocking layer BM where the color filters CF1, CF2, and CF3 may be spaced apart from each other may not overlap the color filters CF1, CF2, and CF3, and such portions of the light blocking layer BM that do not overlap the color filters CF1, CF2, and CF3 may be portions of an upper surface of the second light blocking layer BL2.

Each of the first light blocking layer BL1 and the second light blocking layer BL2 may include a light absorbing material and may be formed through a patterning process using a photoresist. The first light blocking layer BL1 and the second light blocking layer BL2 may be formed through different patterning processes, respectively, and as illustrated in the drawings, the second light blocking layer BL2 may have a physical boundary with the first light blocking layer BL1 and be directly disposed on the first light blocking layer BL1. However, the disclosure may not be limited thereto. The light blocking layer BM may be formed by a patterning process using a half-tone mask, and the first light blocking layer BL1 and the second light blocking layer BL2 may be integral with each other as will be discussed later in conjunction with FIG. 18.

The first light blocking layer BL1 may be entirely disposed on the touch sensing layer TSU in the first display area DA1 and may include the holes OPT1, OPT2, and OPT3. The first light blocking layer BL1 may include the holes OPT1, OPT2, and OPT3 formed to correspond respectively to the emission areas EA1, EA2, and EA3 respectively in a plan view, and may have a shape in which it entirely covers the first display area DA1. Sizes of the holes OPT1, OPT2, and OPT3 of the first light blocking layer BL1 may be greater than sizes of the openings OPE1, OPE2, and OPE3 of the pixel defining film PDL.

The second light blocking layer BL2 may be disposed on the first light blocking layer BL1. Unlike the first light blocking layer BL1, the second light blocking layer BL2 may have a shape that extends in one direction and may be disposed in a mesh structure in the first display area DA1. The second light blocking layer BL2 may be disposed to extend in the fourth direction DR4 and the fifth direction DR5 between adjacent emission areas EA1, EA2, and EA3. The second light blocking layer BL2 may have a smaller width than the first light blocking layer BL1 and may not overlap the holes OPT1, OPT2, and OPT3 of the first light blocking layer BL1. The second light blocking layer BL2 may be disposed between the color filters CF1, CF2, and CF3 disposed adjacent to and in contact with each other.

The light blocking layer BM may include the second light blocking layer BL2 disposed on the first light blocking layer BL1 to have a thickness and a height greater than those in a single-layer structure. In case that the color filters CF1, CF2, and CF3 are formed on the light blocking layer BM, a process of applying and curing an organic material forming the color filters CF1, CF2, and CF3 may be performed. Since the color filters CF1, CF2, and CF3 may be disposed on the encapsulation layer TFEL containing an organic insulating material, the color filters CF1, CF2, and CF3 may include a material capable of being cured at a low temperature. As the color filters CF1, CF2, and CF3 may be cured at the low temperature, structures and disposition locations of the color filters CF1, CF2, and CF3 in cross-sectional view may be affected by a structure of the light blocking layer BM disposed below the color filters CF1, CF2, and CF3.

According to an embodiment, in the display device 10, the light blocking layer BM may include the first light blocking layer BL1 and the second light blocking layer BL2 to have a relatively high thickness, and the color filters CF1, CF2 and CF3 may not be disposed up to other adjacent holes OPT1, OPT2, and OPT3 beyond the second light blocking layer BL2. The adjacent color filters CF1, CF2, and CF3 may be disposed to be spaced apart from each other on the second light blocking layer BL2 by a height of the light blocking layer BM.

As described later, in the display device 10, the light blocking layer BM may also be disposed in the second display area DA2 and the third display area DA3 other than the first display area DA1, and the light blocking layer BM may include holes (fourth holes OPT4 in FIG. 13) in which the color filters CF1, CF2, and CF3 may not be disposed among multiple holes. The color filters CF1, CF2, and CF3 may be not disposed in these holes, the light emitting elements ED may also not be disposed below these holes, and these holes may be areas in which the light received by the optical device 500 of the display device 10 may be incident.

In the first display area DA1, there may be repeatedly disposed holes OPT1, OPT2, and OPT3 and color filters CF1, CF2, and CF3 disposed to correspond to the holes OPT1, OPT2, and OPT3, and a thickness CH1, a shape, or the like, of the color filters CF1, CF2, and CF3 may be uniformly controlled by the light blocking layer BM and the adjacent color filters CF1, CF2, and CF3. However, in the second display area DA2 and the third display area DA3, there may be areas in which the color filters CF1, CF2, and CF3 may be disposed adjacent to each other and areas where the color filters CF1, CF2, and CF3 may not be disposed adjacent to each other, for example, holes OTP4 in which the color filters CF1, CF2, CF3 may not be disposed, according to locations and thus a thickness or shape of the color filters CF1, CF2, and CF3 may be controlled only by the light blocking layer BM.

In case that a thickness of the light blocking layer BM is not sufficient, the material of the color filters CF1, CF2, and CF3 may flow in a curing process of the color filters CF1, CF2, and CF3 and may spread to the holes in which the color filters CF1, CF2, and CF3 are not intended to be disposed. In case that the arrangement of the color filters CF1, CF2, and CF3 may not be controlled by the light blocking layer BM, a thickness difference may occur between the color filters CF1, CF2, and CF3 disposed in the display areas DA: DA1, DA2, and DA3, which may cause a luminance deviation between the display areas DA1, DA2, and DA3. In order to prevent such a problem, in the display device 10 according to an embodiment, the light blocking layer BM may include the first light blocking layer BL1 and the second light blocking layer BL2 to serve as a dam preventing the color filters CF1, CF2, and CF3 from overflowing. The light blocking layer BM may be thick enough to prevent the color filters CF1, CF2, and CF3 from overflowing. The color filters CF1, CF2, and CF3 may be disposed so as not to go over or beyond at least the second light blocking layer BL2 of the light blocking layer BM. As a result, the thickness, the shape, or the like of the color filters CF1, CF2, and CF3 may be controlled by the light blocking layer BM, and accordingly, a thickness of the color filters CF1, CF2, and CF3 may be uniform regardless of location in the display areas DA1, DA2, and DA3 of the display device 10. Accordingly, the display device 10 has an advantage that a luminance deviation may be reduced over an entire surface of the display areas DA1, DA2, and DA3.

In the light blocking layer BM, the first light blocking layer BL1 may include the holes OPT1, OPT2, and OPT3 formed therein, and the second light blocking layer BL2 may serve to prevent the color filters CF1, CF2, and CF3 from overflowing. A first width W1 of the first light blocking layer BL1 may be greater than a second width W2 of the second light blocking layer BL2, and a first thickness H1 of the first light blocking layer BL1 may be smaller than a second thickness H2 of the second light blocking layer BL2. The widths, the thicknesses, and the likes, of the first light blocking layer BL1 and the second light blocking layer BL2 may be related to the thickness and the shape of the color filters CF1, CF2, and CF3 so that the light blocking layer BM may control the shape of the color filters CF1, CF2, and CF3. For example, the thickness H2 and the width W2 of the second light blocking layer BL2 may be great enough for the color filters CF1, CF2, and CF3 to be disposed across the second light blocking layer BL2 without going beyond the second light blocking layer BL2 while covering the holes OPT1, OPT2, and OPT3 of the first light blocking layer BL1.

In an embodiment, the first width W1 of the first light blocking layer BL1 may be at least about 13 μm, and the second width W2 of the second light blocking layer BL2 may be at least about 9 μm. A difference (W1−W2) between the first width W1 of the first light blocking layer BL1 and the second width W2 of the second light blocking layer BL2 may be at least about 4 μm. The first thickness H1 of the first light blocking layer BL1 may be in the range of about 1.5 μm to about 2.5 μm, and the second thickness H2 of the second light blocking layer BL2 may be in the range of about 1.5 μm to about 4 μm. The widths and the thicknesses of the first light blocking layer BL1 and the second light blocking layer BL2 described above may change depending on the material of the color filters CF1, CF2, and CF3. As described later in conjunction with FIGS. 19-22, in an embodiment in which the color filters CF1, CF2, and CF3 may instead be disposed to overlap each other in the display device 10, the widths and the thicknesses of the first light blocking layer BL1 and the second light blocking layer BL2 may be related to widths or thicknesses of portions where the color filters CF1, CF2, and CF3 overlap each other. A more detailed description thereof will be provided later.

It has been illustrated in FIG. 12 that the center of the second light blocking layer BL2 may be parallel to the center of the first light blocking layer BL1, but the disclosure may not be limited thereto. The second light blocking layer BL2 may instead be disposed adjacent to any one of both sides of the first light blocking layer BL1 as in FIG. 17. As can be inferred through a shape of the second light blocking layer BL2 in a plan view illustrated in FIG. 11, the second light blocking layer BL2 may be disposed to be biased to any one side of the first light blocking layer BL1 between specific emission areas EA1, EA2, and EA3 or specific holes OPT1, OPT2, and OPT3 and may be disposed close to the center of the first light blocking layer BL1 in other portions. An arrangement of the second light blocking layer BL2 in a plan view and a location of the second light blocking layer BL2 on the first light blocking layer BL1 may change depending on arrangements of the emission areas EA1, EA2, and EA3, and the holes OPT1, OPT2, and OPT3 and wavelengths of the light emitted from the emission areas EA1, EA2, and EA3.

A planarization layer OC may be disposed on the color filters CF1, CF2, and CF3 to planarize upper ends of the color filters CF1, CF2, and CF3. The planarization layer OC may be a colorless light transmitting layer that does not have a color of a visible light band. For example, the planarization layer OC may include a colorless light transmitting organic material such as an acrylic resin.

Figure 13:
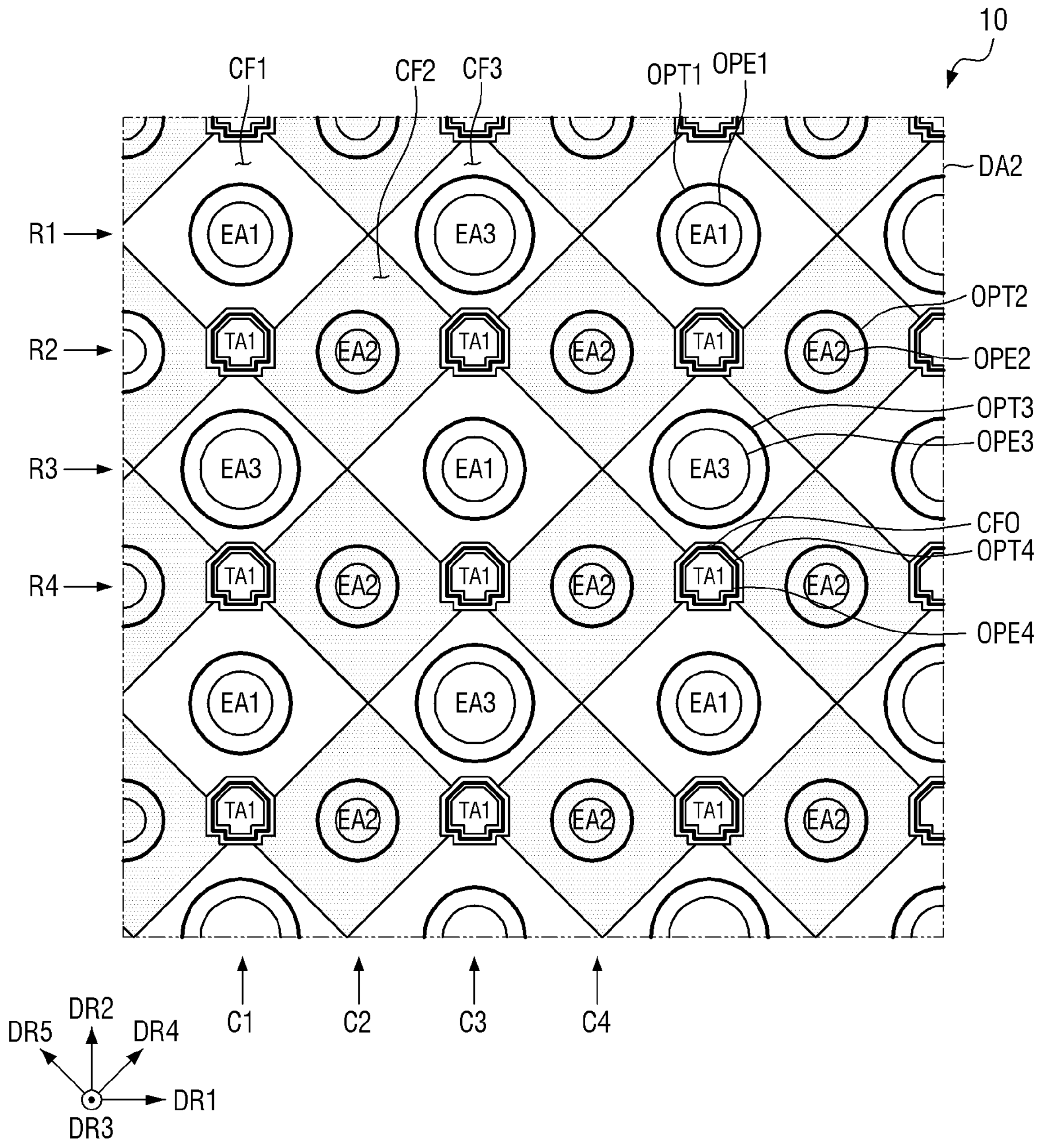
FIG. 13 is a plan view illustrating an arrangement of multiple emission areas in a second display area of the display device according to an embodiment.
Figure 14:
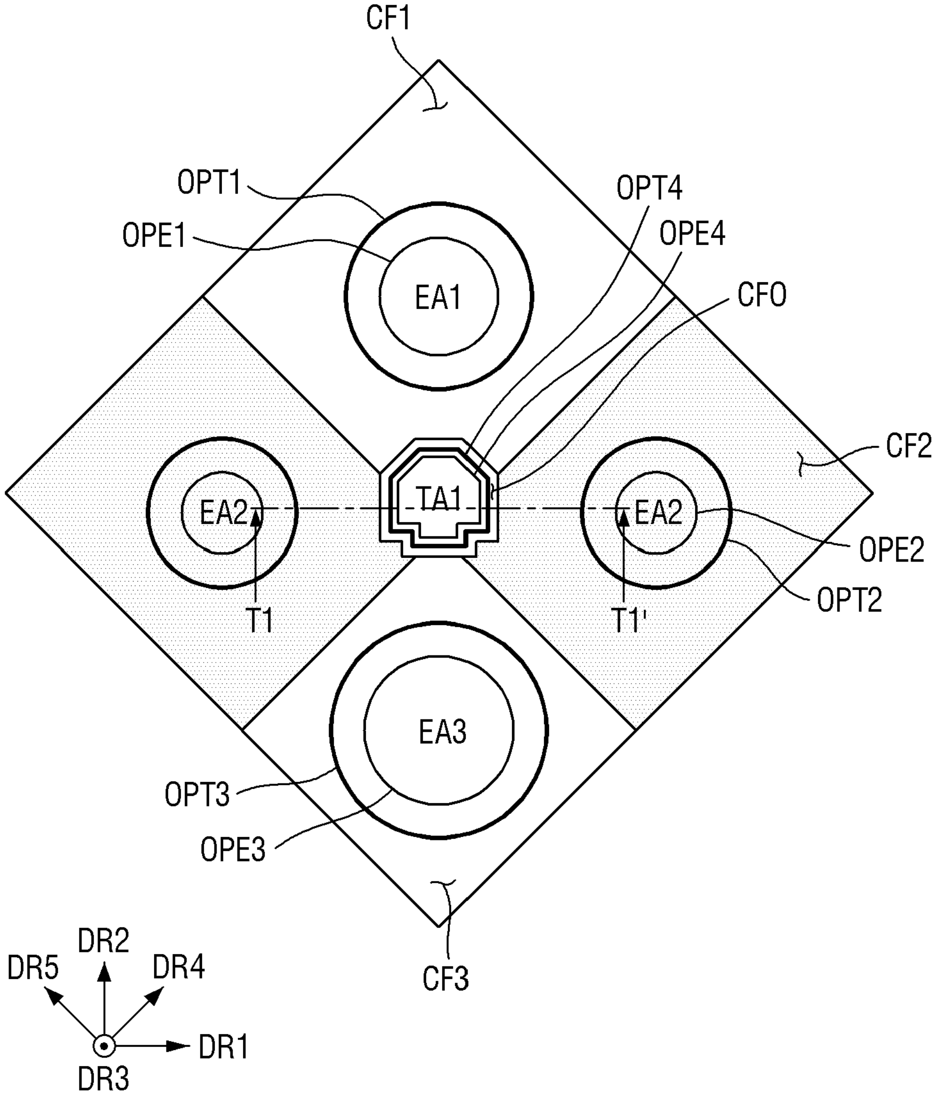
FIG. 14 is a plan view illustrating, in more detail, an arrangement of multiple color filters disposed in the second display area of FIG. 13.
Figure 15:
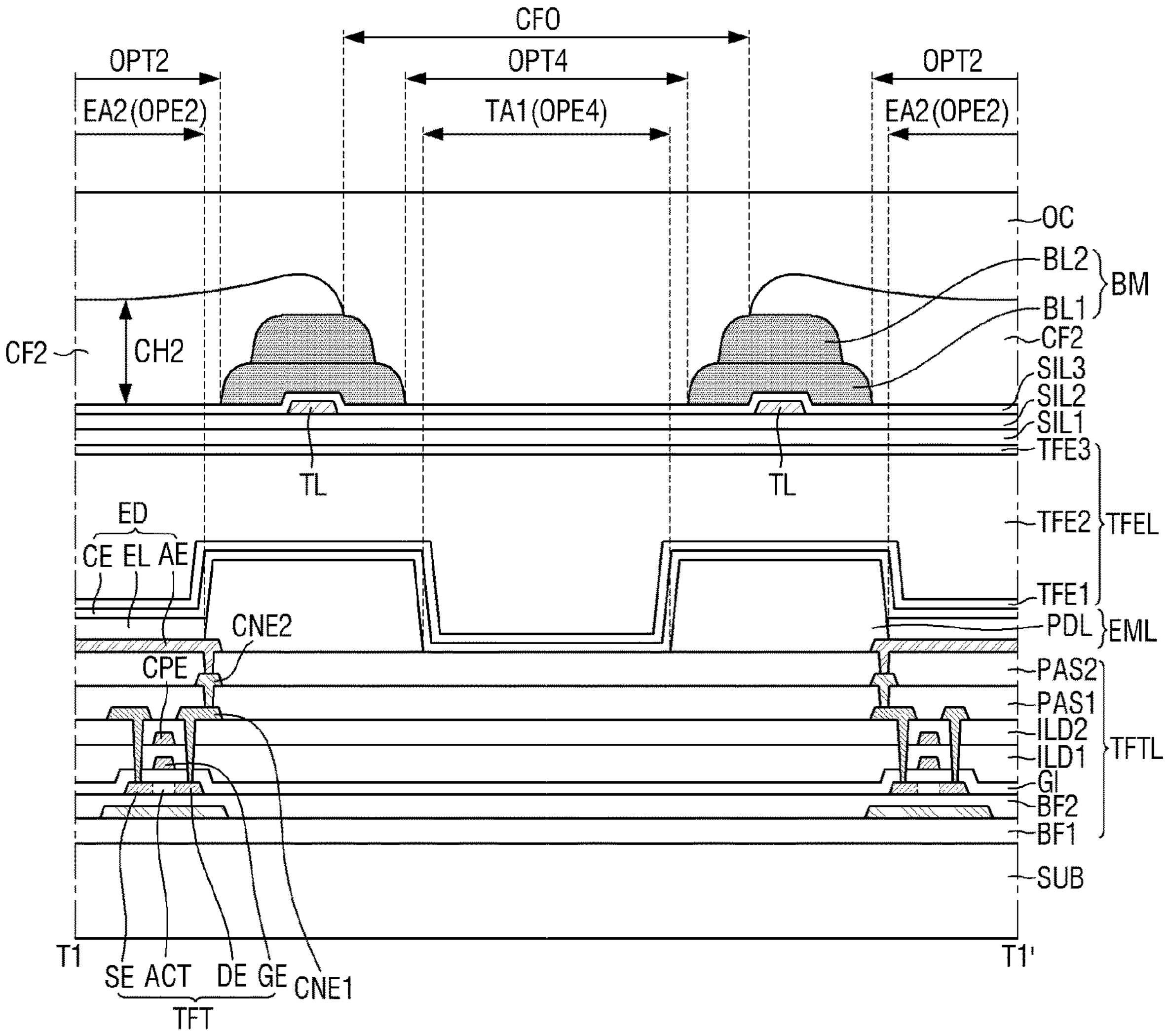
FIG. 15 is a schematic cross-sectional view taken along line T1-T1' of FIG. 14.
Figure 16:
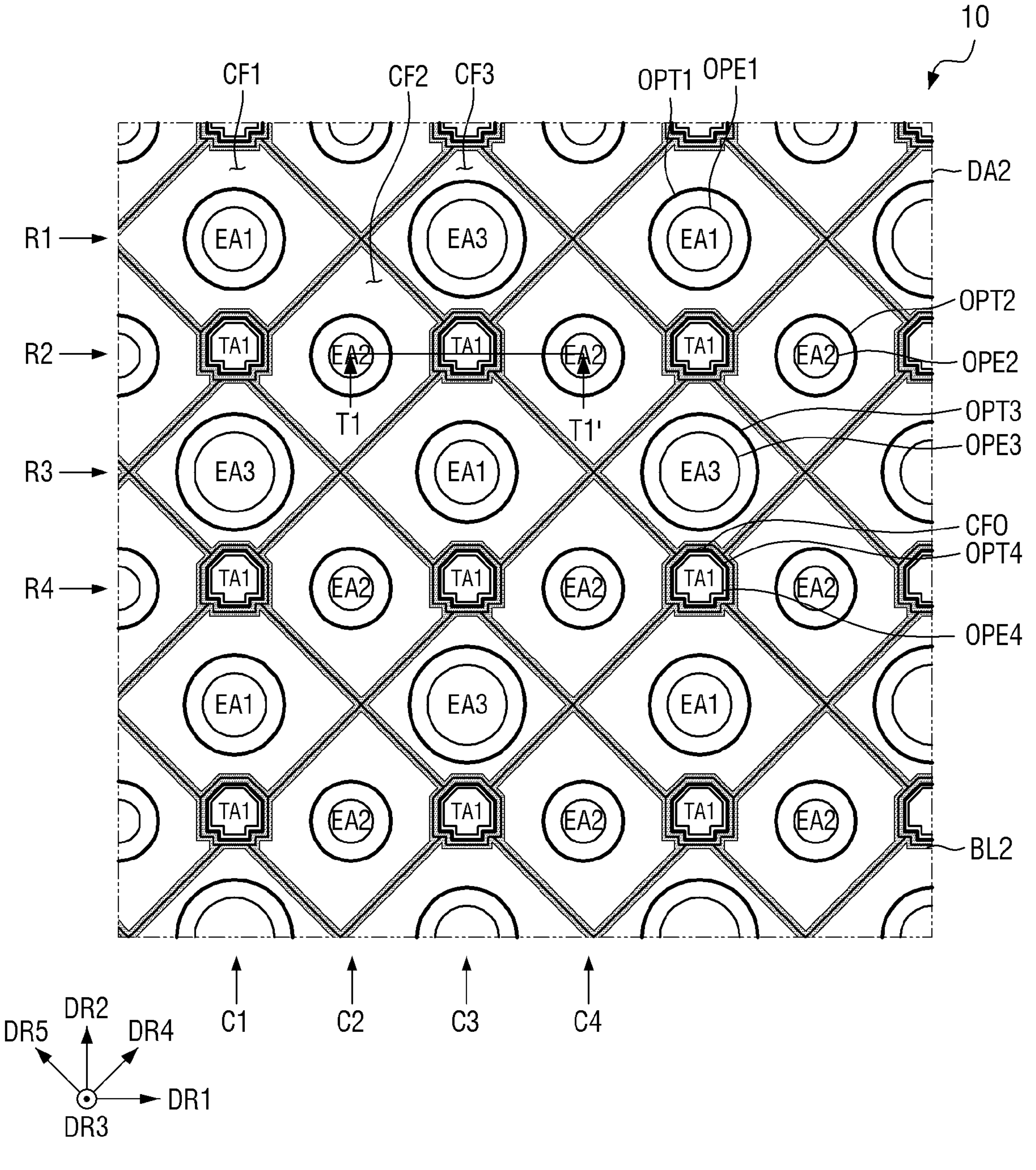
FIG. 16 is a view illustrating an arrangement in a plan view of a second light blocking layer disposed in the second display area of the display device according to an embodiment.

FIG. 13 is a plan view illustrating an arrangement of emission areas in a second display area of the display device according to an embodiment, FIG. 14 is a plan view illustrating an arrangement of color filters disposed in the second display area of FIG. 13, FIG. 15 is a schematic cross-sectional view taken along line T1-T1' of FIG. 14, and FIG. 16 is a view illustrating an arrangement in a plan view of a second light blocking layer disposed in the second display area of the display device according to an embodiment. The second display area DA2 has been illustrated and described in FIGS. 13 to 16, but a description thereof may also be equally applied to the third display area DA3.

Referring to FIGS. 13 to 16, the display device 10 may include multiple emission areas EA1, EA2, and EA3 and first transmission areas TA1 disposed in the second display area DA2 and the third display area DA3 of the display area DA. Touch electrodes TL, color filters CF1, CF2, and CF3, and a light blocking layer BM may also be disposed in the second display area DA2. A description thereof may be the same as that described above.

The first transmission areas TA1 may be disposed between neighboring emission areas EA1, EA2, and EA3. For example, the first transmission area TA1 may be disposed between two emission areas adjacent to each other in the first direction DR1 and between two emission areas adjacent to each other in the second direction DR2. The first transmission areas TA1 may be disposed in the first column C1 and the third column C3 in the second row R2 and the fourth row R4. On the other hand, the first transmission areas TA1 may not be disposed in the second column C2 and the fourth column C4 in the first row R1 and the third row R3.

The first transmission areas TA1 may be defined by fourth openings OPE4 formed in the pixel defining film PDL of the light emitting element layer EML. The light blocking layer BM may include fourth holes OPT4 overlapping the first transmission areas TA1 so as correspond to the first transmission areas TA1, and the color filters CF1, CF2, and CF3 may not be disposed on the first transmission areas TA1 and may form color filter openings CFO overlapping the fourth holes OPT4.

The touch electrode TL may also be disposed in the second display area DA2. The touch electrode TL may be disposed to substantially extend in the fourth direction DR4 and the fifth direction DR5, and portions of the touch electrode TL may extend in the first direction DR1 and the second direction DR2 so as to bypass the first transmission areas TA1. Portions of the touch electrode TL extending in the fourth direction DR4 and the fifth direction DR5 may be bent in the second direction DR2 in the vicinity of the first transmission areas TA1. Subsequently, the touch electrode TL may be disposed to be bent again in the first direction DR1, and accordingly may be disposed to bypass the first transmission areas TA1.

In the display device 10, the color filters CF1, CF2, and CF3 disposed in the second display area DA2 may be disposed to correspond to the emission areas EA1, EA2, and EA3, respectively, but may be disposed so as not to cover the first transmission areas TA1 disposed between two adjacent emission areas EA1, EA2, and EA3. The first transmission areas TA1 may be defined by the fourth openings OPE4 of the pixel defining film PDL, the fourth holes OPT4 may be formed in the light blocking layer BM so as to correspond to the fourth openings OPE4, and the color filter CF1, CF2 and CF3 may form the color filter openings CFO. The first transmission areas TA1 may not be covered by the pixel defining film PDL, the light blocking layer BM, and the color filters CF1, CF2, and CF3, and the optical device 500 disposed in the second display area DA2 may sense light introduced from the outside through the first transmission areas TA1.

The pixel defining film PDL may include the fourth openings OPE4 disposed in the second display area DA2. The fourth opening OPE4 may define the first transmission area TA1. A size or diameter of the fourth opening OPE4 may be smaller than the sizes or diameters of the first to third openings OPE1, OPE2, and OPE3, and a size or area of the first transmission area TA1 may be smaller than the sizes or areas of the first to third emission areas EA1, EA2, and EA3. The pixel defining film PDL may include a light absorbing material, but since the pixel defining film PDL may not be disposed in the first transmission areas TA1, light may be smoothly incident on the optical device 500. The common electrode CE of the light emitting element ED and the encapsulation layer TFEL may be disposed in the fourth openings OPE4 of the pixel defining film PDL.

The touch electrode TL may be disposed so as not to overlap the fourth openings OPE4 of the pixel defining film PDL. As described above, the touch electrode TL may be disposed to bypass the first transmission areas TA1 in a plan view, and may be disposed to be spaced apart from the fourth openings OPE4 in cross-sectional view.

The light blocking layer BM may be disposed on the third touch insulating layer SIL3 of the touch sensing layer TSU and may include the fourth holes OPT4 overlapping the fourth openings OPE4. A size or area of the fourth hole OPT4 may be greater than the size or area of the fourth opening OPE4. Since the fourth holes OPT4 of the light blocking layer BM may be formed to be greater than the fourth openings OPE4 of the pixel defining film PDL, even though light introduced from the outside may be incident not only from the front surface of the display device 10 but also from the side surfaces of the display device 10, the optical device 500 may sense the light. The light blocking layer BM may include a light absorbing material, but since the light blocking layer BM may not be disposed in the first transmission areas TA1, the light may be smoothly incident on the optical device 500.

The color filters CF1, CF2, and CF3 of the color filter layer CFL may be disposed on the light blocking layer BM, but may be disposed so as not to cover the first transmission areas TA1. The color filters CF1, CF2, and CF3 may be disposed to be spaced apart from edges of the fourth holes OPT4 of the light blocking layer BM. Accordingly, the color filters CF1, CF2, and CF3 may not be disposed on portions of the light blocking layer BM in contact with the fourth holes OPT4, such that portions of the light blocking layer BM may be exposed. The color filter openings CFO may be formed in areas in which the color filters CF1, CF2, and CF3 may not be disposed as areas overlapping the first transmission areas TA1. A size or area of the color filter openings CFO may be greater than the size or area of the fourth hole OPT4, and portions of an upper surface of the light blocking layer BM in the second display area DA2 may not be covered by the color filters CF1, CF2, and CF3.

As described above, the light blocking layer BM may include the first light blocking layer BL1 and the second light blocking layer BL2 to prevent the color filters CF1, CF2 and CF3 from overflowing into the fourth holes OPT4. The second color filters CF2 disposed in areas adjacent to the fourth holes OPT4 may be disposed across the second light blocking layer BL2, and portions of the upper surface of the light blocking layer BM that do not overlap the color filters CF1, CF2, and CF3 in the second display area DA2 may be portions of upper surfaces of the first light blocking layer BL1 and the second light blocking layer BL2. As illustrated in FIG. 16, the second light blocking layer BL2 may be disposed between the adjacent emission areas EA1, EA2, and EA3 or between the first to third holes OPT1, OPT2, and OPT3, and may be disposed to surround the fourth holes OPT4 or the first transmission areas TA1 in the display area DA2.

Since the light blocking layer BM includes the second light blocking layer BL2, even though the color filters CF1, CF2, and CF3 may not be disposed in the fourth holes OPT4 in the second display area DA2 and unlike the first display area DA1, it may be possible to control a thickness and a shape of the color filters CF1, CF2, and CF3. The thickness CH1 of the color filters CF1, CF2, and CF3 disposed in the first display area DA1 may be substantially the same as a thickness CH2 of the color filters CF1, CF2, and CF3 disposed in the second display area DA2, and the color filters CF1, CF2, and CF3 may have a uniform thickness over the entire surface of the display area DA.

The first transmission area TA1 may be defined by the fourth opening OPE4, and a shape of the fourth opening OPE4 in a plan view may be variously modified. It has been illustrated in the drawings that the fourth opening OPE4 or the first transmission area TA1 has a polygonal shape. Accordingly, the fourth hole OPT4 of the light blocking layer BM and the color filter opening CFO of the color filter layer CFL may also have a polygonal shape in a plan view. However, the disclosure may not be limited thereto, and a shape of the first transmission area TA1 may be modified into a circular shape or a quadrangular shape, and shapes of the fourth hole OPT4 of the light blocking layer BM and the color filter opening CFO of the color filter layer CFL in a plan view may also be variously modified. A shape of the first transmission area TA1 and shapes of the fourth hole OPT4 of the light blocking layer BM and the color filter opening CFO of the color filter layer CFL in a plan view may instead be different from each other. However, a size or area of the color filter opening CFO may be greater than the size or area of the fourth hole OPT4 of the light blocking layer BM, and the size or area of the fourth hole OPT4 of the light blocking layer BM may be greater than the size or area of the first transmission area TA1 so that external light may readily be incident on the first transmission area TA1.

In an embodiment, a maximum diameter of the color filter opening CFO measured in the second direction DR2 may be greater than maximum diameters of the fourth opening OPE4 of the pixel defining film PDL and the fourth hole OPT4 of the light blocking layer BM measured in the second direction DR2. A maximum diameter of the color filter opening CFO measured in the first direction DR1 may be greater than maximum diameters of the fourth opening OPE4 of the pixel defining film PDL and the fourth hole OPT4 of the light blocking layer BM measured in the first direction DR1. The color filter opening CFO may be formed so that an edge thereof may be spaced apart from an edge of the first transmission area TA1 or the fourth opening OPE4 of the pixel defining film PDL by an interval (e.g., predetermined or selectable interval) so that portions of the light blocking layer BM do not overlap the color filters CF1, CF2, and CF3. An interval between the edge of the color filter opening CFO and the edge of the fourth opening OPE4 may be smaller than a diameter of the fourth opening OPE4 measured in the first direction DR1. However, the disclosure may not be limited thereto. The shapes and sizes of the fourth hole OPT4 and the color filter opening CFO of the light blocking layer BM formed to correspond to the first transmission area TA1 may be variously modified.

In the display device 10 according to an embodiment, the color filters CF1, CF2, and CF3 may have different shapes in a plan view according to locations of the display area DA. The color filters CF1, CF2, and CF3 disposed in the first display area DA1 have a shape in which respective sides thereof substantially extend in the fourth direction DR4 or the fifth direction DR5 in a plan view, and edge portions where the respective sides meet may have an angular shape. On the other hand, the color filters CF1, CF2, and CF3 disposed in the second display area DA2 have a shape in which respective sides thereof substantially extend in the fourth direction DR4 or the fifth direction DR5 in a plan view, but edge portions where the respective sides meet may be recessed into the color filters CF1, CF2, and CF3 so that the color filter openings CFO may be formed.

The display device 10 according to an embodiment may include the color filter layer CFL disposed on the display layer DU to control the reflection of external light. In the display device 10, the light blocking layer BM forming areas in which the color filters CF1, CF2, and CF3 may be disposed may include multiple layers to have a thickness (H1+H2) large enough to prevent the color filters CF1, CF2, and CF3 from overflowing. Accordingly, the display device 10 may control the color filters CF1, CF2, and CF3 to have a uniform thickness over the entire surface of the display area DA, and may have uniform luminance regardless of location in the display areas DA1, DA2, and DA3. Hereinafter, other embodiments of the display device 10 will be described with reference to other drawings.

Figure 17:
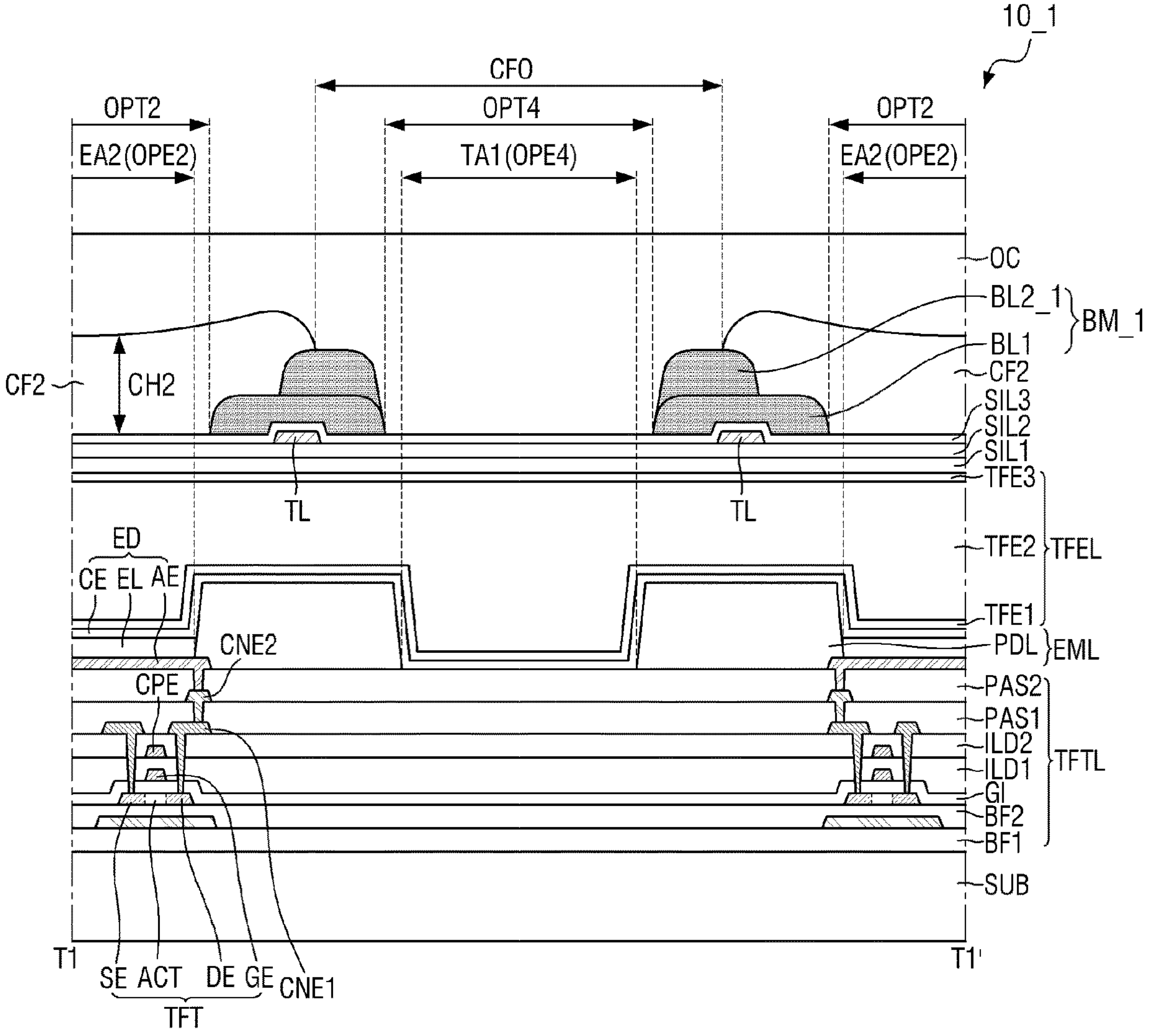
FIG. 17 is a schematic cross-sectional view illustrating a portion of a second display area of a display device according to an embodiment.

FIG. 17 is a schematic cross-sectional view illustrating a portion of a second display area of a display device according to an embodiment. Referring to FIG. 17, in a display device 10_1 according to an embodiment, the center of a first light blocking layer BL1 in a light blocking layer BM_1 may not be coincident with the center of a second light blocking layer BL2_1 in the light blocking layer BM_1. The second light blocking layer BL2_1 may be disposed to be biased to one side of both sides of the first light blocking layer BL1 in a width direction. In some embodiments, the second light blocking layer BL2_1 may be disposed to be in contact with the fourth hole OPT4 at a portion of in the light blocking layer BM_1 disposed to be in contact with the fourth hole OPT4 in the second display area DA2. The display device 10_1 may have a structure in which a location of the second light blocking layer BM2_1 in the light blocking layer BM_1 more readily prevent the color filters CF1, CF2, and CF3 from overflowing into the fourth holes OPT4.

Figure 18:
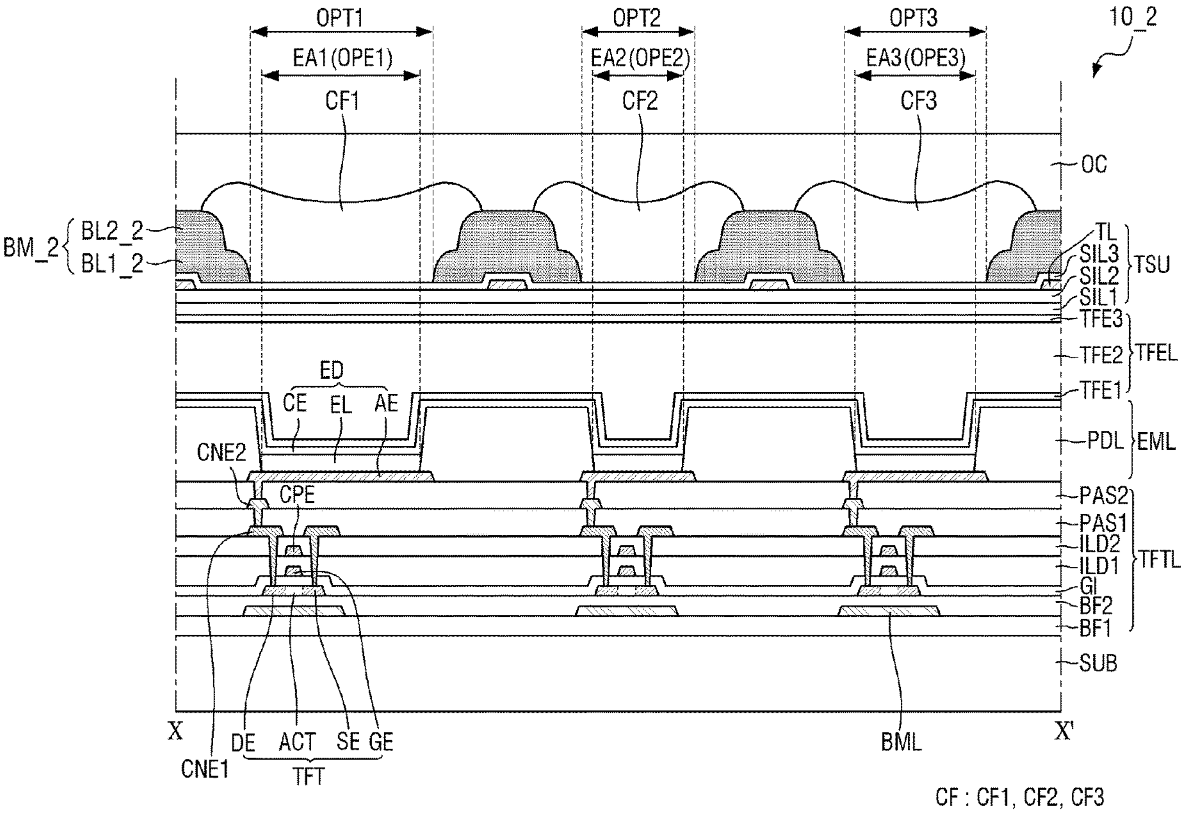
FIG. 18 is a schematic cross-sectional view illustrating a portion of a first display area of a display device according to an embodiment.

FIG. 18 is a schematic cross-sectional view illustrating a portion of a first display area of a display device according to an embodiment. Referring to FIG. 18, in a display device 10_2 according to an embodiment, a light blocking layer BM_2 may be formed through a patterning process using a half-tone mask, and a first light blocking layer BL1_2 and a second light blocking layer BL2_2 having different widths may be integral with each other. The display device 10_2 has an advantage that the number of manufacturing processes may be decreased as compared with the above-described embodiment by changing a mask in a patterning process.

Figure 19:
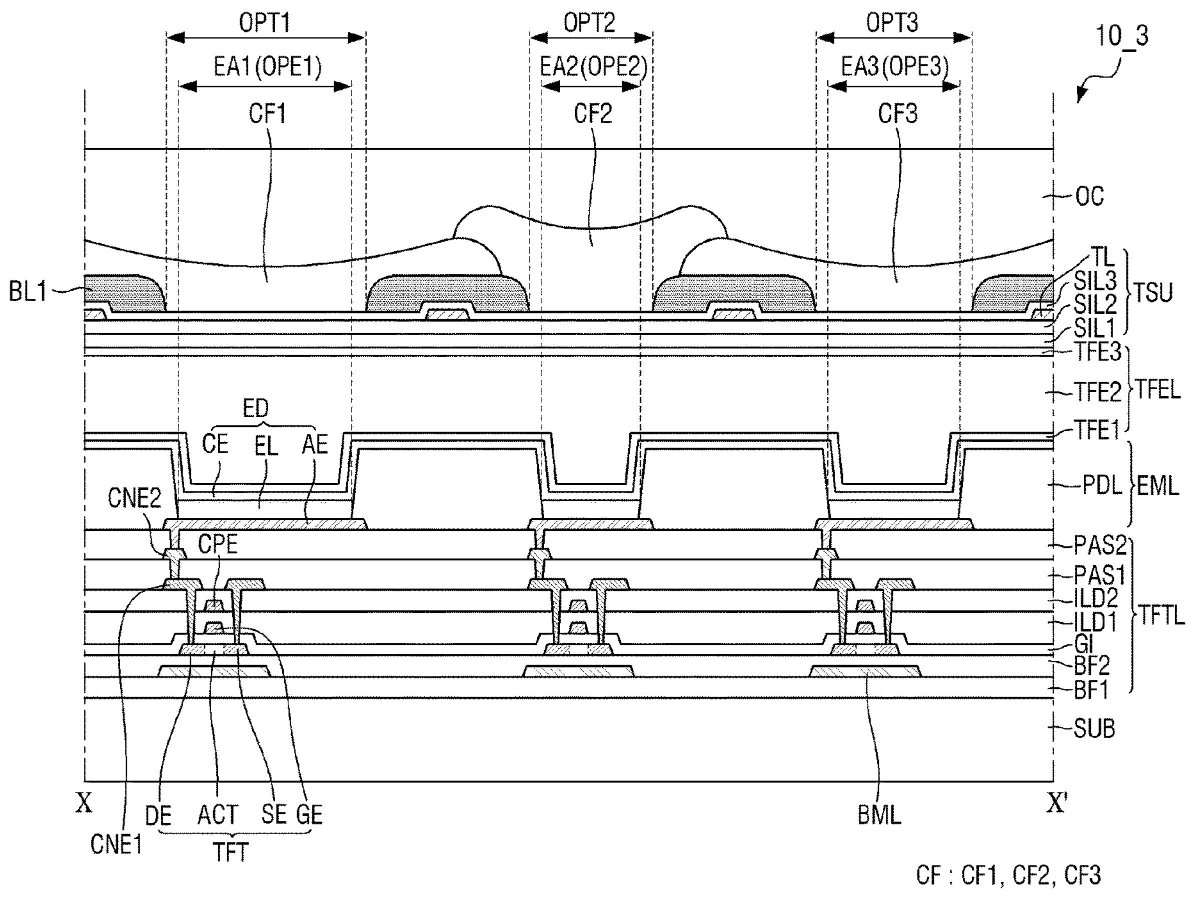
FIG. 19 is a schematic cross-sectional view illustrating a portion of a first display area of a display device according to an embodiment.
Figure 20:
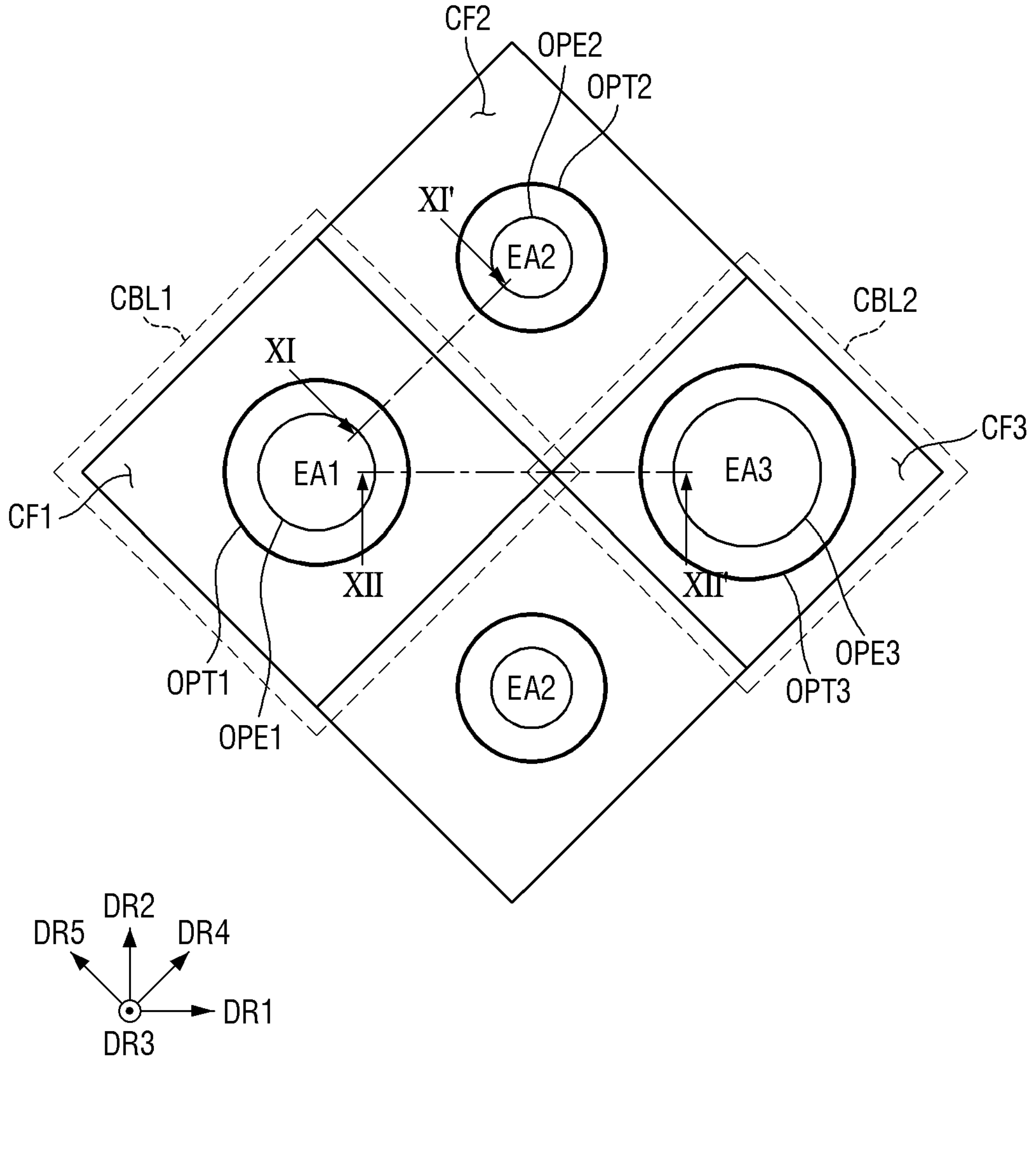
FIG. 20 is a plan view illustrating an arrangement of multiple color filters disposed in the first display area of the display device of FIG. 19.
Figure 21:
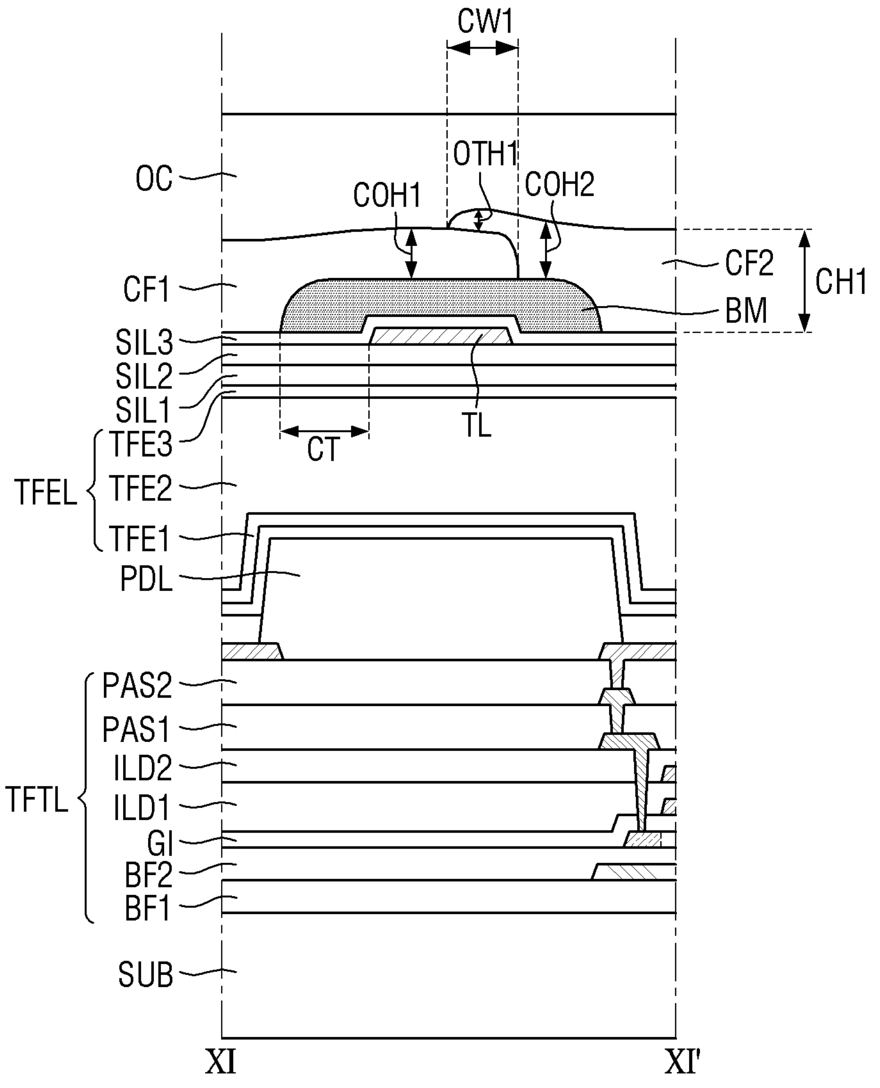
FIG. 21 is a schematic cross-sectional view taken along line XI-XI' of FIG. 20.
Figure 22:
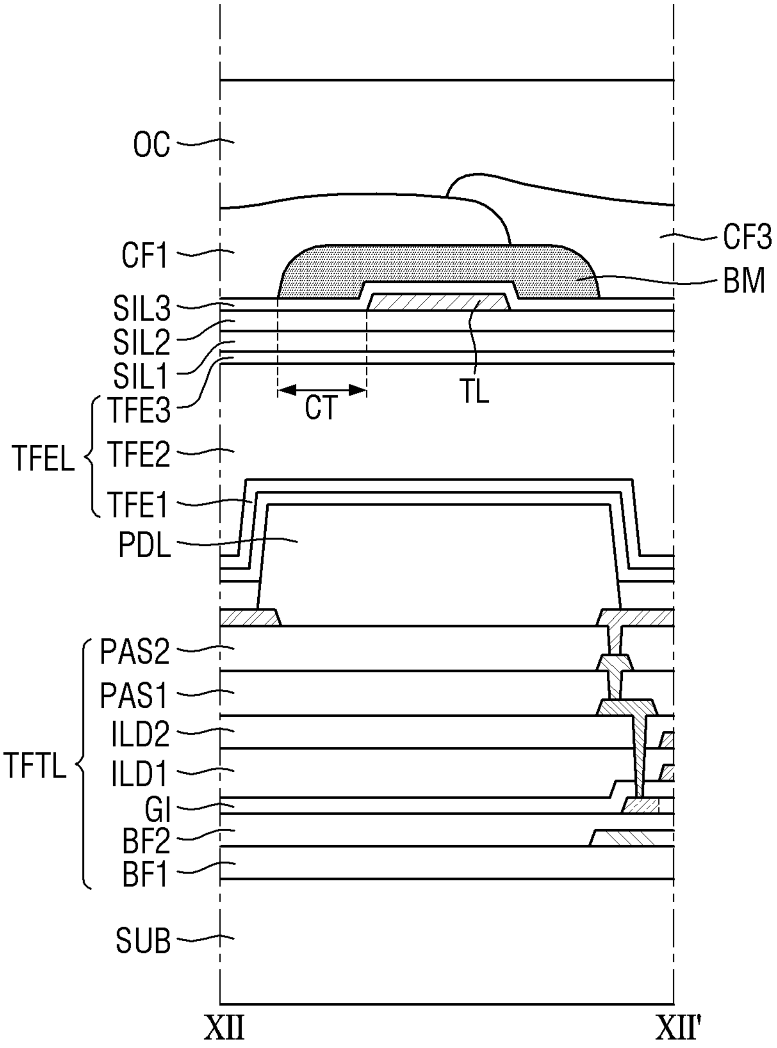
FIG. 22 is a schematic cross-sectional view taken along line XII-XII' of FIG. 20.

FIG. 19 is a schematic cross-sectional view illustrating a portion of a first display area of a display device according to an embodiment, FIG. 20 is a plan view illustrating an arrangement of color filters disposed in the first display area of the display device of FIG. 19, FIG. 21 is a schematic cross-sectional view taken along line XI-XI' of FIG. 20, and FIG. 22 is a schematic cross-sectional view taken along line XII-XII' of FIG. 20. Referring to FIGS. 19 to 22, in a display device 10_3 according to an embodiment, color filters CF1, CF2, and CF3 disposed in the first display area DA1 may be disposed to overlap other color filters CF1, CF2, and CF3 adjacent thereto on the light blocking layer BM. The color filters CF1, CF2, and CF3 disposed on the light blocking layer BM may be disposed so that two color filters CF1, CF2, and CF3 adjacent to each other completely cover the light blocking layer BM. The two color filters CF1, CF2, and CF3 adjacent to each other may be disposed to partially overlap each other on the light blocking layer BM. Such overlap between the color filters CF1, CF2, and CF3 may reduce the reflection of external light due to the light blocking layer BM, and an overlap arrangement of the color filters CF1, CF2, and CF3 may be designed to further reduce the reflection of external light.

FIG. 20 is a plan view illustrating edges CBL1 and CBL2 of the first color filter CF1 and the third color filter CF3 respectively in an arrangement in a plan view of the first color filter CF1, the second color filter CF2, and the third color filter CF3 adjacent to each other. FIGS. 21 and 22 illustrate cross-sections where the first and second color filters CF1 and CF2 and the first and third color filters CF1 and CF3 overlap each other, respectively.

In the display device 10_3, only the first light blocking layer BL1 of the light blocking layer BM may be disposed in the first display area DA1, the first color filter CF1 and the second color filter CF2 adjacent to each other may be disposed to overlap each other on the first light blocking layer BL1, and the second color filter CF2 and the third color filter CF3 may also be disposed to overlap each other on the first light blocking layer BL1. The first color filter CF1 and the third color filter CF3 adjacent to each other may also be disposed to overlap each other on the first light blocking layer BL1.

According to an embodiment, in the display device 10_3, the second color filter CF2, which may be the green color filter, may be disposed at a level above each of the first color filter CF1, which may be the red color filter, and the third color filter CF3, which may be the blue color filter. The third color filter CF3, which may be the blue color filter, may be disposed at a level above the first color filter CF1, which may be the red color filter. In processes of manufacturing the display device 10_3, the color filters CF1, CF2, and CF3 may be formed by a photoresist process, and processes for forming the color filters CF1, CF2, and CF3 may be performed in the order of the first color filter CF1, the third color filter CF3, and the second color filter CF2.

In FIG. 20, in addition to an arrangement of the color filters CF1, CF2, and CF3 viewed from above, boundary lines CBL1 and CBL2 of the first color filter CF1 and the third color filter CF3 respectively disposed below the second color filter CF2 have been illustrated. A first boundary line CBL1 of the first color filter CF1 may overlap the second color filter CF2 and be disposed below the second color filter CF2. A second boundary line CBL2 of the third color filter CF3 may also overlap the second color filter CF2 and be disposed below the second color filter CF2. A portion of the first boundary line CBL1 of the first color filter CF1 overlapping the third color filter CF3 may be disposed below the third color filter CF3. It has been illustrated in the plan view of FIG. 20 that the second color filter CF2 may be disposed above other color filters, and accordingly, a boundary line of the second color filter CF2 may be exposed from the top. On the other hand, it has been illustrated in the plan view of FIG. 20 that the first color filter CF1 and the third color filter CF3 may be disposed below the second color filter CF2, and accordingly, the boundary lines CBL1 and CBL2 of the first color filter CF1 and the third color filter CF3 respectively may not be exposed.

The light blocking layer BM may include a material absorbing light, but some of the light incident from the outside may also be reflected by the light blocking layer BM. The color filters CF1, CF2, and CF3 disposed in the holes OPT1, OPT2, and OPT3 of the light blocking layer BM may be partially disposed on (e.g., directly on) the light blocking layer BM, and may be disposed to completely cover the light blocking layer BM. The two different color filters CF1, CF2, and CF3 adjacent to each other may include different colorants and may be disposed to overlap each other on the light blocking layer BM, and accordingly, reflection of external light due to the light blocking layer BM may be reduced. However, transmissivity of the color filters CF1, CF2, and CF3 may change depending on materials constituting the color filters CF1, CF2, and CF3, and reflection of external light may be more effectively reduced according to the overlap order of the color filters CF1, CF2, and CF3.

In an embodiment, transmissivity of the second color filter CF2, which may be the green color filter, may be smaller than transmissivity of the first color filter CF1 and transmissivity of the third color filter CF3. The second color filter CF2 may be disposed at a level above other color filters (e.g., the first color filter CF1 and the third color filter CF3) on the light blocking layer BM. The transmissivity of the third color filter CF3, which may be the blue color filter, may be smaller than the transmissivity of the first color filter CF1, which may be the red color filter, and the third color filter CF3 may be disposed on the first color filter CF1. In case that the color filters CF1, CF2, and CF3 having a relatively low transmissivity are disposed at a level above other color filters CF1, CF2, and CF3, scattered reflection of light from the light blocking layer BM may be reduced in portions where the different color filters CF1, CF2, and CF3 overlap each other. Accordingly, it may be possible to prevent light reflected from the light blocking layer BM from being emitted to the outside, and the display device 10_3 may reduce the reflection of external light occurring in areas other than the emission areas EA1, EA2, and EA3.

The reflection of external light by the display device 10_3 may include reflection from the emission areas EA1, EA2, and EA3, reflection from light transmitting areas formed by the holes OPT1, OPT2, and OPT3 of the light blocking layer BM, and reflection by the light blocking layer BM. In case that the sizes of the openings OPE1, OPE2, and OPE3 of the pixel defining film PDL, the sizes of the holes OPT1, OPT2, and OPT3 of the light blocking layer BM, intervals between the openings OPE1, OPE2, OPE3 and the holes OPT1, OPT2, and OPT3, and the like, may be adjusted, external light reflection from the emission areas EA1, EA2, and EA3 and the light transmitting areas may be controlled. However, in case that the above conditions are controlled, factors related to light efficiency of the display device 10_3, such as efficiency and a lifespan of the light emitting elements ED, side visibility of the display device 10_3, and performance such as touch sensitivity of the touch sensing layer TSU may be affected.

On the other hand, in case that the color filters CF1, CF2, and CF3 are disposed to overlap each other on the light blocking layer BM, the reflection of external light due to the light blocking layer BM may be significantly reduced without affecting the light efficiency of the display device 10_3 described above. By adjusting areas and thicknesses of the color filters CF1, CF2, and CF3 in a plan view, widths of overlapping portions between the different color filters CF1, CF2, and CF3, and the like, a color perception of the reflected external light may be controlled to be a color that gives convenience to the user. For example, a color perception of external light reflected from the emission areas EA1, EA2, and EA3 and the light transmitting areas as may be controlled according to the areas of the color filters CF1, CF2, and CF3, and external light reflected from the light blocking layer BM may change depending on areas, widths, or the like, of portions where the color filters CF1, CF2, and CF3 overlap each other.

As described above, thicknesses and widths of the portions where the color filters CF1, CF2, and CF3 overlap each other on the light blocking layer BM may be variously designed while the areas of the color filters CF1, CF2, and CF3 in a plan view may be designed to have a specific ratio therebetween. For example, in the case of a portion where the first color filter CF1 and the second color filter CF2 overlap each other as illustrated in FIG. 21, a maximum thickness of the first color filter CF1 may be greater than a thickness COH1 of a portion of the first color filter CF1 disposed on the light blocking layer BM. A maximum thickness CH1 of the second color filter CF2 may be greater than a thickness COH2 of a portion of the second color filter CF2 disposed on the light blocking layer BM. A thickness OTH1 of the second color filter CF2 disposed on the first color filter CF1 on the light blocking layer BM may be smaller than the maximum thickness CH1 of the first color filter CF1 and the second color filter CF2 and the thicknesses COH1 and COH2 of the portions of the first color filter CF1 and the second color filter CF2 respectively disposed on the light blocking layer BM.

A portion where the third color filter CF3 and the first color filter CF1 illustrated in FIG. 22 overlap each other may be similar to that described above with reference to FIG. 21. A thickness of a portion of the third color filter CF3 disposed on the first color filter CF1 on the light blocking layer BM may be smaller than a maximum thickness of the third color filer CF3 and the first color filter CF1 and thicknesses of portions of the third color filer CF3 and the first color filter CF1 disposed on the light blocking layer BM.

In an embodiment, the maximum thickness CH1 of the color filters CF1, CF2, and CF3 may be in the range of about 2 μm to about 4 μm, and the thickness OTH1 of a portion of the second color filter CF2 disposed on the first color filter CF1 or disposed on the third color filter CF3 and the thickness of the portion of the third color filter CF3 disposed on the first color filter CF1 may be in the range of from about 0.5 μm to about 1.5 μm.

In an embodiment, a width of the portions where the color filters CF1, CF2, and CF3 overlap each other may be greater than the thickness OTH1 of portions of the color filters CF1, CF2, and CF3 disposed above other color filters. For example, a width of the portion of the second color filter CF2 disposed on the first color filter CF1 may be greater than the thickness OTH1 of a portion of the second color filter CF2 disposed above other color filters. A width of the portions where the color filters CF1, CF2, and CF3 overlap each other may be in the range of about 1.5 μm to about 2.5 μm. However, the thickness of the color filters CF1, CF2, and CF3 and ratios between the widths and the thicknesses OTH1 and OTH2 of the portions where the color filters CF1, CF2, and CF3 overlap each other may not be limited to the numerical values described above, and may change depending on sizes of the color filters CF1, CF2, and CF3 in a plan view.

The arrangement of the color filters CF1, CF2, and CF3 and the thicknesses or the widths of the portions where the color filters CF1, CF2, and CF3 overlap each other may be designed so that the second color filter CF2 having a relatively low transmissivity may be disposed at an upper portion in consideration of the areas of the color filters CF1, CF2, and CF3. For example, the boundary line CBL1 of the first color filter CF1 may be disposed relatively adjacent to the second emission area EA2 and the second color filter CF2 may be disposed adjacent to the third emission area EA3 so that the second color filter CF2 having a smaller area in a plan view than other color filters may be disposed on the first color filter CF1 and the third color filter CF3. However, the disclosure may not be limited thereto. In order to further reduce the reflection of external light due to the light blocking layer BM, locations of the boundary lines of the first color filter CF1 and the third color filter CF3 may be designed differently, and the widths of the portions where the color filters CF1, CF2, and CF3 overlap each other may also change. This will be described with reference to other embodiments.

In the display device 10_3 according to an embodiment, the second color filter CF2, which may be the green color filter having the relatively low transmissivity, may be disposed above other color filters, and the adjacent color filters CF1, CF2, and CF3 may be disposed to overlap each other while completely covering the light blocking layer BM. In the display device 10_3, the color filters may be disposed to overlap each other on the light blocking layer BM in areas other than the emission areas EA1, EA2, and EA3 and the light transmitting areas, and accordingly, it may be possible to effectively reduce the reflection of external light without affecting light efficiency, a lifespan, and the like of the light emitting elements ED.

Figure 23:
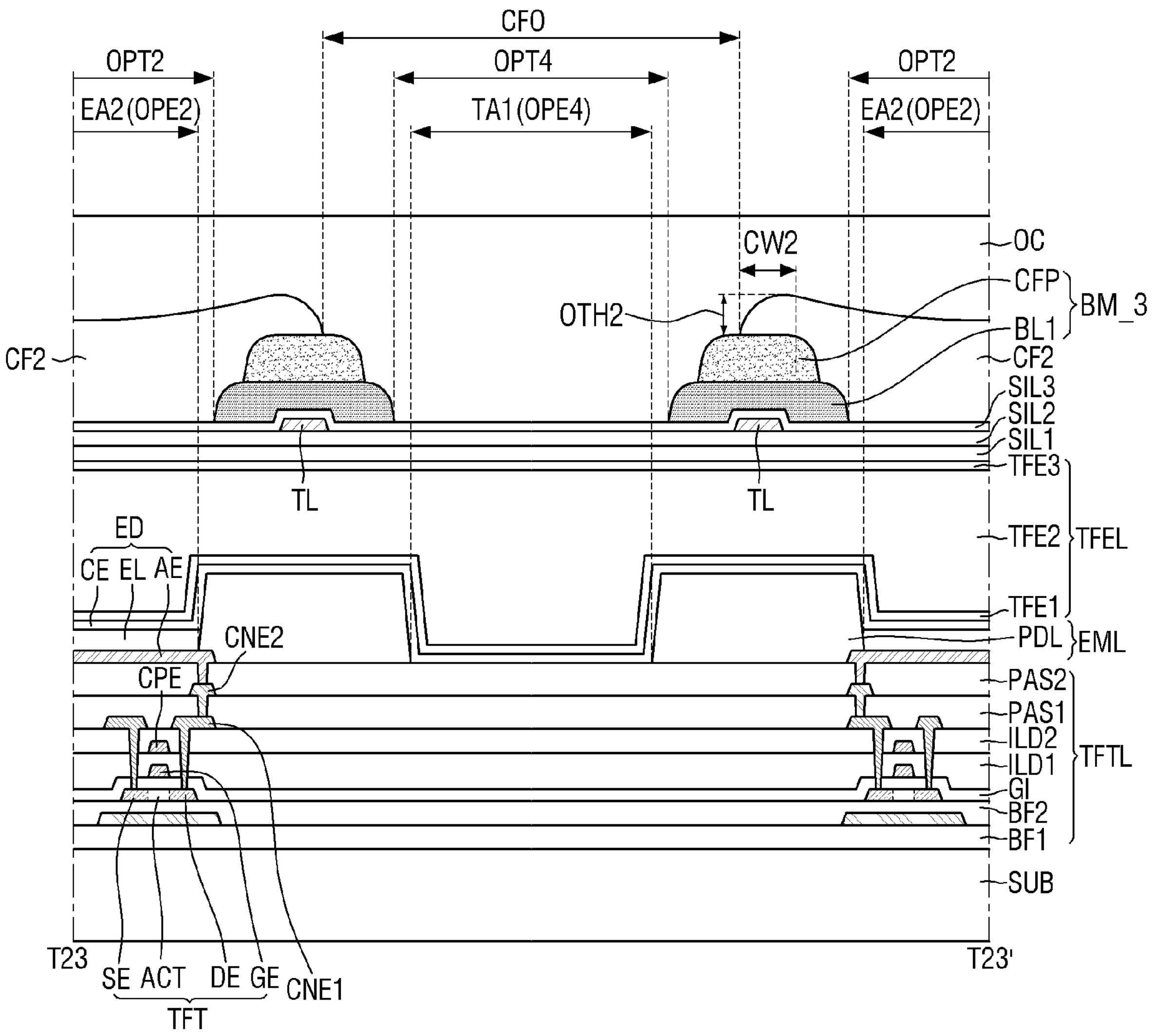
FIG. 23 is a schematic cross-sectional view illustrating a portion of a second display area of the display device of FIG. 20.
Figure 24:
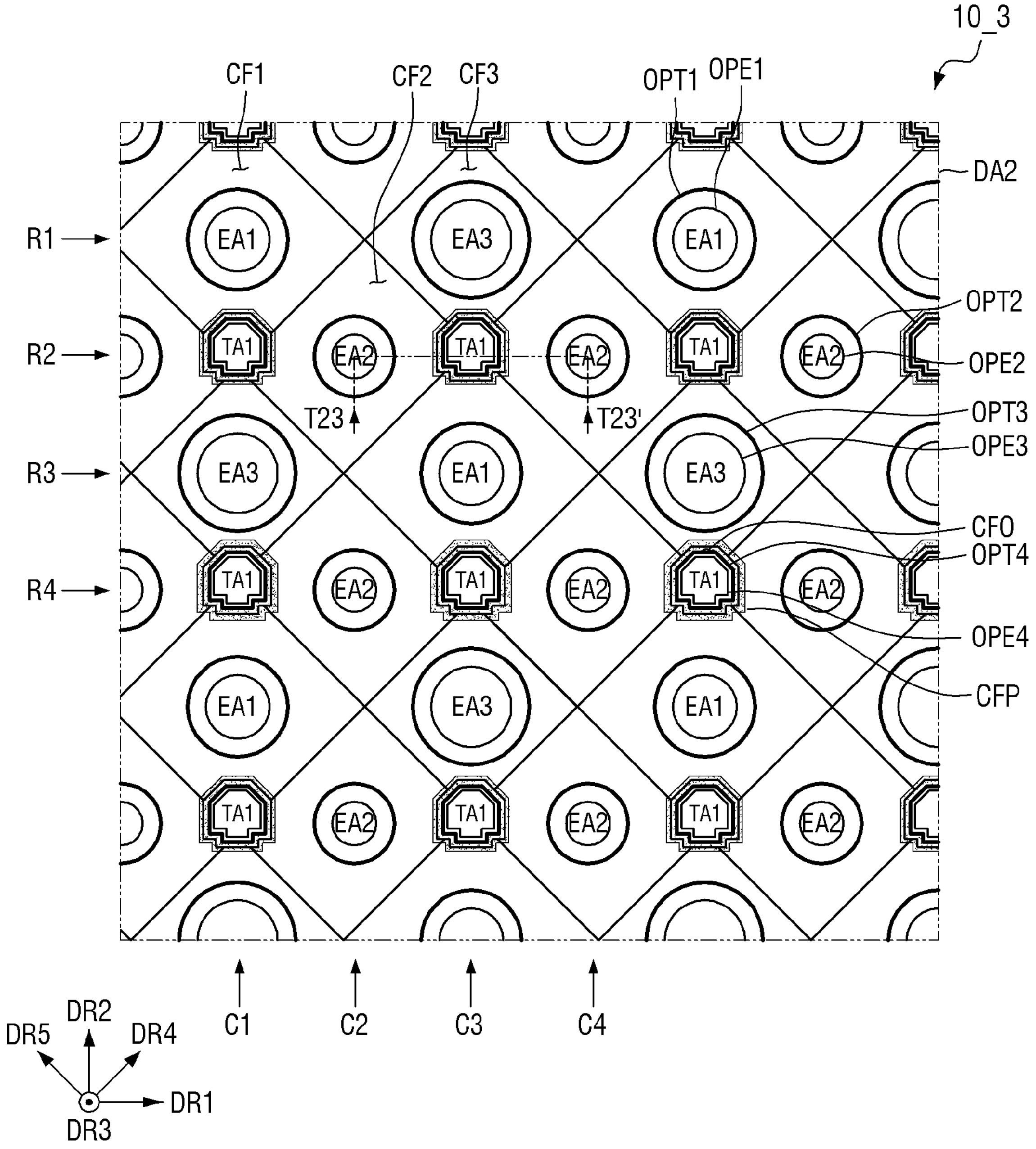
FIG. 24 is a view illustrating an arrangement in a plan view of a color pattern layer disposed in the second display area of the display device of FIG. 23.

FIG. 23 is a schematic cross-sectional view illustrating a portion of a second display area of the display device along line T23-T23' of FIG. 24, and FIG. 24 is a view illustrating an arrangement in a plan view of a color pattern layer disposed in the second display area of the display device of FIG. 23. Referring to FIGS. 23 and 24 in addition to FIGS. 19 to 22, in the display device 10_3, a light blocking layer BM_3 may include only one layer, for example, a first light blocking layer BL1 in the first display area DA1, and may include a first light blocking layer BL1 and a color pattern CFP disposed on the first light blocking layer BL1 in the second display area DA2 and the third display area DA3.

According to an embodiment, the color pattern CFP may include the same material as the first color filter CF1. The color pattern CFP may be formed simultaneously with the first color filter CF1 in a process of forming the first color filter CF1, and may not be subjected to a separate patterning process unlike the above-described embodiment. Although not illustrated in the drawings, the first color filters CF1 adjacent to the fourth holes OPT4 and the color pattern CFP may be integral with each other. The color pattern CFP may prevent the color filters CF1, CF2, and CF3 adjacent to the fourth holes OPT4 from overflowing into the fourth holes OPT4 in the second display area DA2 and the third display area DA3. The color pattern CFP may play the same role as the second light blocking layer BL2 in an embodiment of FIGS. 13 to 16.

However, unlike the second light blocking layer BL2, the color pattern CFP may be disposed to surround only the fourth holes OPT4 in the second display area DA2 and the third display area DA3, and may not be disposed between other adjacent first to third holes OPT1, OPT2, and OPT3. The color filters CF1, CF2, and CF3 disposed adjacent to the fourth holes OPT4 may be disposed on the color pattern CFP, and portions of an upper surface of the light blocking layer BM_3 that do not overlap the color filters CF1, CF2, and CF3 in the second display area DA2 and the third display area DA3 may be portions of upper surfaces of the first light blocking layer BL1 and the color pattern CFP. Also in the second display area DA2 and the third display area DA3, the adjacent color filters CF1, CF2, and CF3 may overlap each other on the first light blocking layer BL1 of the light blocking layer BM_3.

The color pattern CFP may have the same thickness and width as the second light blocking layer BL2 described above. For example, the color pattern CFP may have a width of about 5 μm to about 9 μm, and a width difference between the color pattern CFP and the first light blocking layer BL1 may be at least about 4 μm. A thickness H2 of the color pattern CFP may be in the range of about 1.5 μm to about 4 μm. In the first display area DA1, the light blocking layer BM_3 may include only the first light blocking layer BL1, and the color filters CF1, CF2, and CF3 may overlap each other on the first light blocking layer BL1. In the second display area DA2 and the third display area DA3, the light blocking layer BM_3 may include the first light blocking layer BL1 and the color pattern CFP, but only the first light blocking layer BL1 may be disposed in portions of the second display area DA2 and the third display area DA3 and the color filters CF1, CF2, and CF3 may overlap each other on the first light blocking layer BL1. The color pattern CFP may have a width and a thickness that change so that the color filters CF1, CF2, and CF3 have a uniform thickness throughout the display area DA while preventing the color filters CF1, CF2, and CF3 from overflowing into the fourth holes OPT4.

For example, a width CW1 of portions where the adjacent color filters CF1, CF2, and CF3 overlap each other may be in the range of about 1.5 μm to about 2.5 μm, and a width of the color pattern CFP may be set so that a width CW2 of portions of the color filters CF1, CF2, and CF3 disposed on the color patterns CFP may be greater than the width of the portions where the adjacent color filters CF1, CF2, and CF3 overlap each other. The color pattern CFP may have a width of at least about 2.5 μm or may be in a range from about 5 μm to about 9 μm.

A thickness OTH1 of portions of the color filters CF1, CF2, and CF3 disposed at an upper portion in the portions where the color filters CF1, CF2, and CF3 overlap each other may be in the range of about 0.5 μm to about 1.5 μm. A thickness of the color pattern CFP may be set so that the thickness OTH1 of the portions of the color filters CF1, CF2, and CF3 disposed at the upper portion in the portions where the color filters CF1, CF2, and CF3 overlap each other may be similar to a thickness OHT2 of portions of the color filters CF1, CF2, and CF3 disposed on the color pattern CFP, and a height of the light blocking layer BM_3 in the second display area DA2 may be greater than a maximum thickness of the color filters CF1, CF2, and CF3. The color pattern CFP may have a thickness of at least about 1.5 μm or may be in a range from about 1.5 μm to about 4 μm. However, the disclosure may not be limited thereto, and the thickness and the width of the color pattern CFP in the light blocking layer BM_3 may be variously modified depending on a material or shape of the color filters CF1, CF2, and CF3.

In the display device 10_3 according to an embodiment, the light blocking layer BM_3 may include the color pattern CFP that may be partially disposed, such that the adjacent color filters CF1, CF2, and CF3 may be disposed to overlap each other in the display area DA while the thickness of the color filters CF1, CF2, and CF3 may be kept uniform. The display device 10_3 has an advantage of being able to further reduce an intensity of reflected external light while having uniform luminance over the entire surface of the display area DA.

Figure 25:
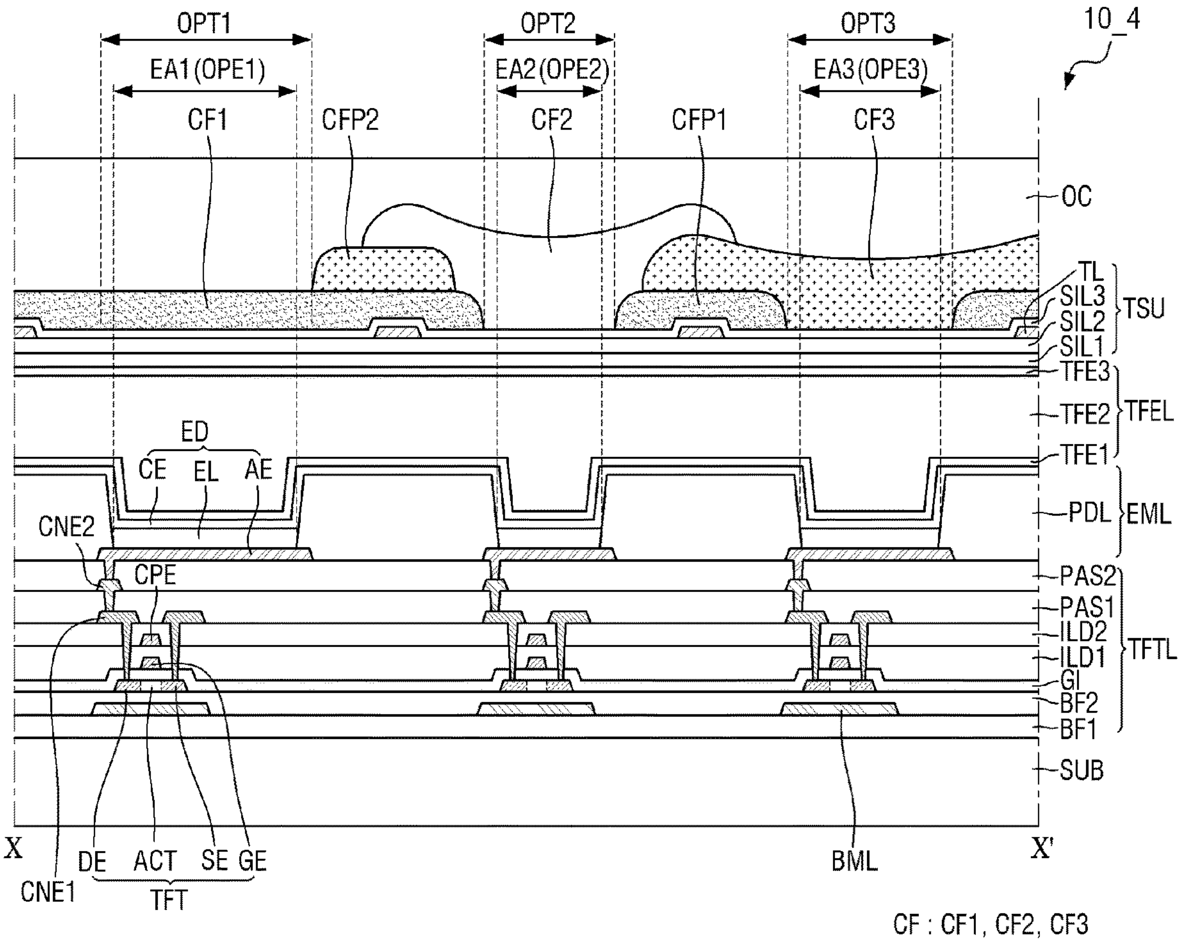
FIG. 25 is a schematic cross-sectional view illustrating a portion of a first display area of a display device according to an embodiment.
Figure 26:
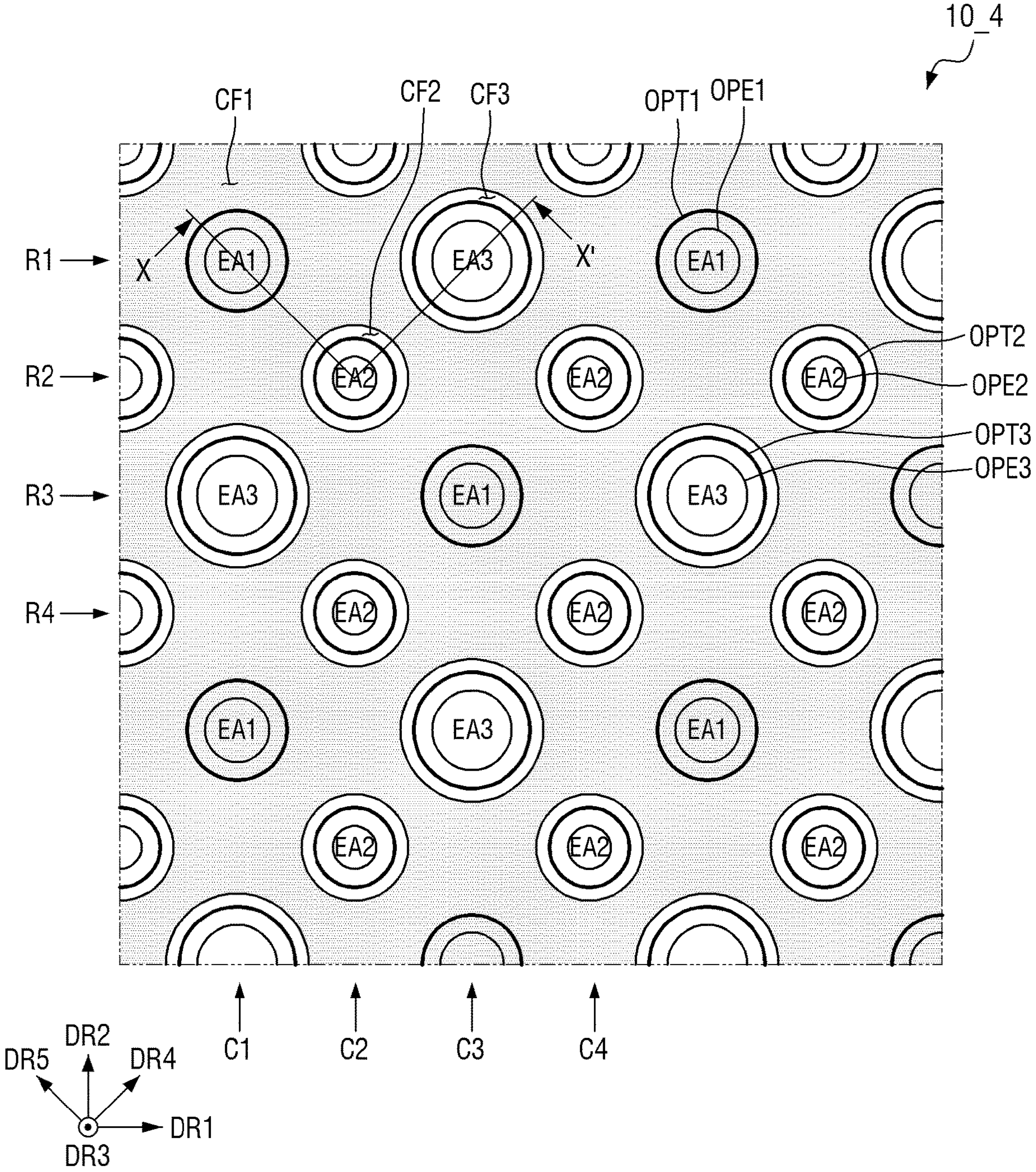
FIG. 26 is a plan view illustrating multiple color filters disposed in the first display area of the display device of FIG. 25.
Figure 27:
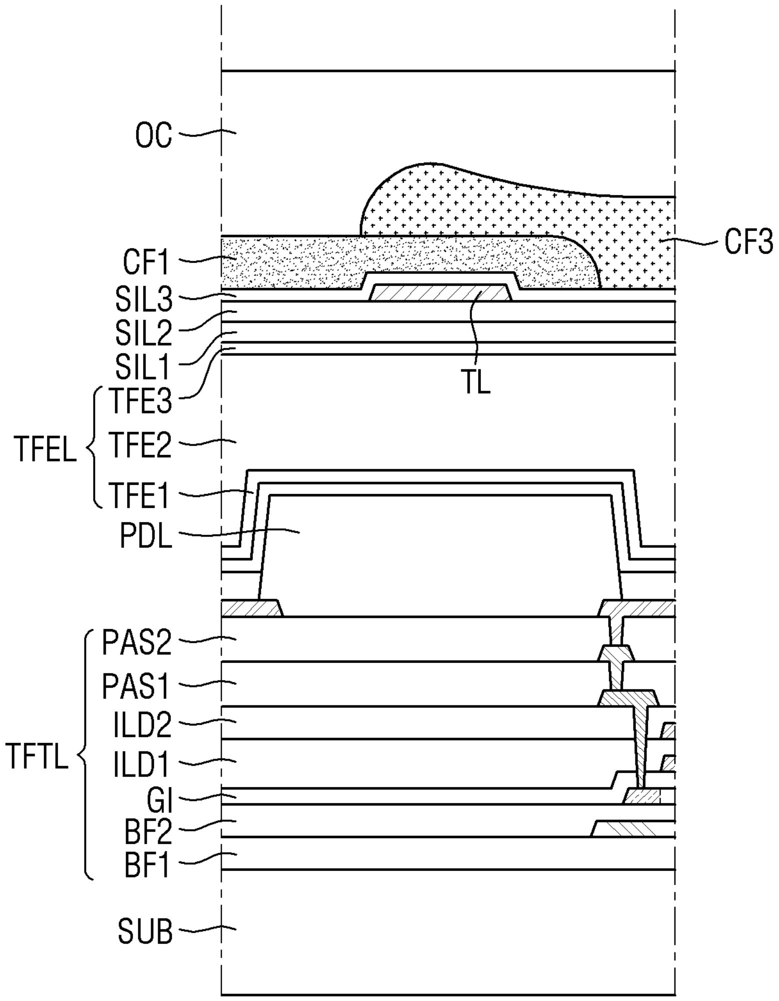
FIG. 27 is a schematic cross-sectional view illustrating a portion where a first emission area and a third emission area may be adjacent to each other in the first display area of the display device of FIG. 25.
Figure 28:
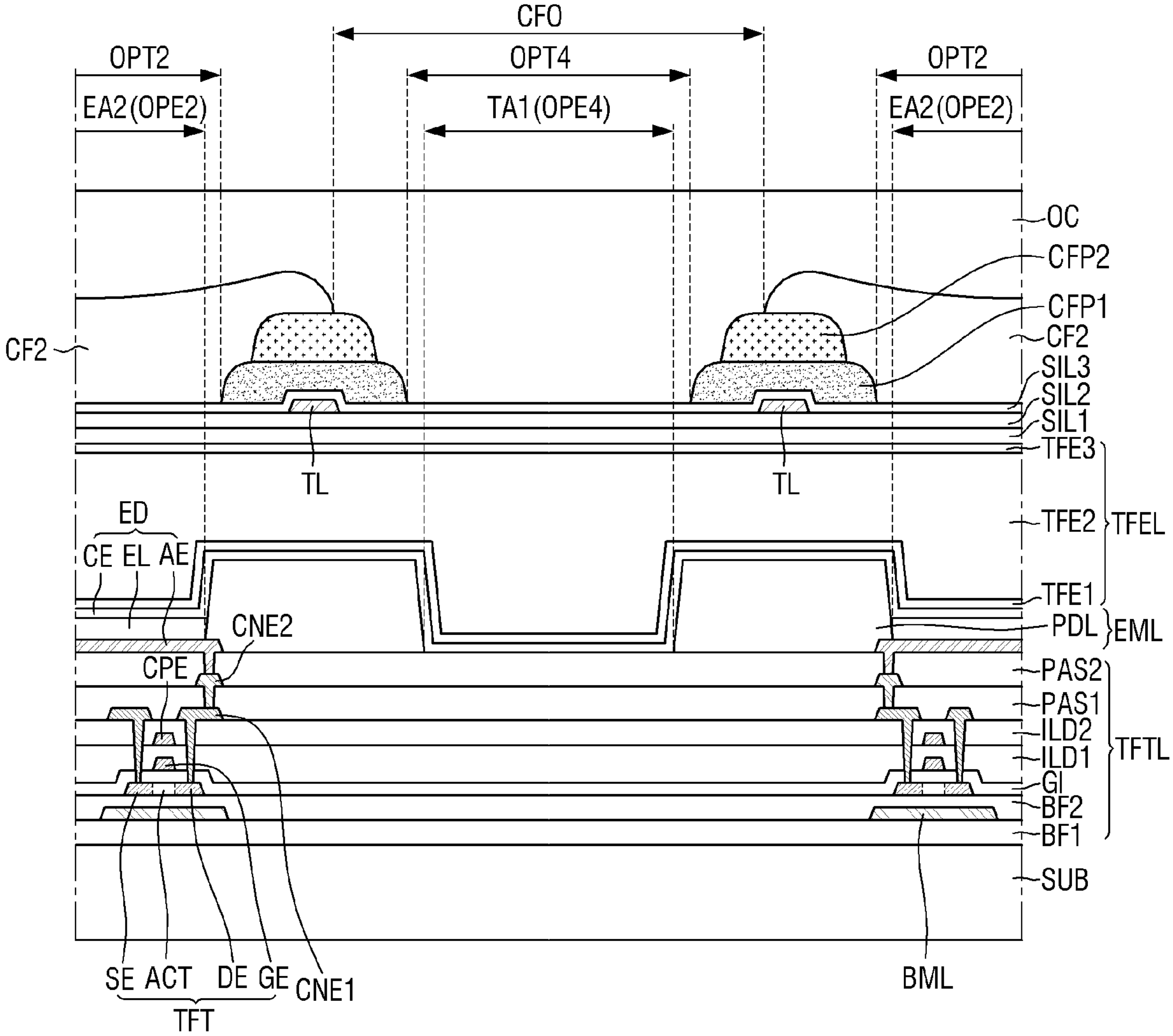
FIG. 28 is a schematic cross-sectional view illustrating a portion of a second display area of the display device of FIG. 25.

FIG. 25 is a schematic cross-sectional view taken along X-X' of FIG. 26 illustrating a portion of a first display area of a display device according to an embodiment, FIG. 26 is a plan view illustrating color filters disposed in the first display area of the display device of FIG. 25, FIG. 27 is a schematic cross-sectional view illustrating a portion where a first emission area and a third emission area may be adjacent to each other in the first display area of the display device of FIG. 25 and FIG. 28 is a schematic cross-sectional view illustrating a portion of a second display area of the display device of FIG. 25. Referring to FIGS. 25 to 28, in a display device 10_4 according to an embodiment, the light blocking layer BM may be omitted and the light blocking layer BM may be replaced with multiple color patterns CFP1 and CFP2. In the display device 10_4, the color patterns CFP1 and CFP2 including the same material as some of the color filters CF1, CF2 and CF3 may replace a role of the light blocking layer BM. The color patterns CFP1 and CFP2 may include a first color pattern CFP1 and a second color pattern CFP2 including different colorants, and may be disposed to overlap each other. The color patterns CFP1 and CFP2 may prevent the color filters CF1, CF2 and CF3 from overflowing through a structure in which they overlap each other while absorbing light introduced from the outside and blocking transmission of the light introduced from the outside.

The first color pattern CFP1 may include the same material as the first color filter CF1 and may be disposed in the same structure as the first light blocking layer BL1 in the above-described embodiments. The first color pattern CFP1 may be disposed on the third touch insulating layer SIL3 of the touch sensing layer TSU and cover a conductive line of the touch electrode TL. The first color pattern CFP1 may include multiple holes OPT1, OPT2, and OPT3 disposed to overlap the emission areas EA1, EA2, and EA3 to be entirely disposed on the touch sensing layer TSU in the display area DA, and may have a shape that includes the holes OPT1, OPT2, and OPT3. However, the first color pattern CFP1 may include a same material as the first color filter CF1 and be integrated with the first color filter CF1.

The second color pattern CFP2 may include a same material as the third color filter CF3 and may be disposed in a structure similar to that of the second light blocking layer BL2 in the above-described embodiments. The second color pattern CFP2 may be disposed on the first color filter CF1 or the first color pattern CFP1 and may have a greater thickness than the first light blocking layer BL1 of other embodiments. The second color pattern CFP2 may be disposed in substantially the same pattern as the first color pattern CFP1. For example, a width of the second color pattern CFP2 disposed in the first display area DA1 may be substantially similar to a width of the first color pattern CFP1. However, a width of the second color pattern CFP2 disposed in the second display area DA2 and the third display area DA3 may be smaller than that of the first color pattern CFP1 around the fourth hole OPT4. The second color pattern CFP2 may include a same material as the third color filter CF3 and the second color pattern CFP2 and the third color filter CF3 may be integral with each other. The first color pattern CFP1 including a red colorant and the second color pattern CFP2 including a blue colorant may be disposed to overlap each other, and accordingly, may play a role similar to that of the light blocking layer BM. The second color pattern CFP2 may be disposed on the first color pattern CFP1 to prevent the second color filters CF2 from overflowing into other adjacent holes OPT1, OPT2, and OPT3.

The second color filters CF2 may be disposed to correspond to the second holes OPT2 in which the first color pattern CFP1 and the second color pattern CFP2 may not be disposed. A portion of the second color filter CF2 may be disposed on the second color pattern CFP2 or the third color filter CF3, and color filters or color patterns having red, green, and blue colorants may overlap each other around the second hole OPT2. Similar to the above-described embodiment, the color filters CF1, CF2, and CF3 having different colorants may be formed in the order of the first color filter CF1, the third color filter CF3, and the second color filter CF2. Accordingly, the third color filter CF3 may be disposed on the first color filter CF1 at a boundary between the first hole OPT1 and the third hole OPT3.

The first color pattern CFP1 and the second color pattern CFP2 may be integral with the first color filter CF1 and the third color filter CF3, respectively, and may be disposed over the entire surface of the display area DA. The first color filter CF1 and the first color pattern CFP1 may be disposed over the entire surface except for the second hole OPT2, the third hole OPT3, and the fourth hole OPT4, and the third color filter CF3 and the second color pattern CFP2 may be disposed over the entire surface except for the first hole OPT1, the second hole OPT2, and the fourth hole OPT4.

In the second display area DA2 and the third display area DA3, the color patterns CFP1 and CFP2 disposed around the fourth hole OPT4 may serve as dams preventing the color filters CF1, CF2, and CF3 from overflowing. A description thereof may be the same as that of the light blocking layer BM described above.

In concluding the detailed description, those skilled in the art will appreciate that many variations and modifications can be made to the embodiments without substantially departing from the principles of the disclosure. Therefore, the disclosed embodiments of the invention may be used in a generic and descriptive sense only and not for purposes of limitation.

What is claimed is:

1. A display device comprising:

a plurality of emission areas, each of the plurality of emission areas including a light emitting element, wherein some of the plurality of emission areas are disposed in a first display area and others of the plurality of emission areas are disposed in a second display area;

a plurality of light transmitting areas disposed in the second display area, each of the plurality of light transmitting areas being absent of the light emitting element;

a pixel defining film including a plurality of openings, the plurality of openings overlapping corresponding ones of the plurality of emission areas and/or corresponding ones of the plurality of light transmitting areas;

a light blocking layer including a plurality of holes overlapping corresponding ones of the plurality of emission areas and/or corresponding ones of the plurality of light transmitting areas, the light blocking layer being disposed between adjacent ones of the plurality of emission areas and between adjacent ones of the plurality of light transmitting areas; and a plurality of color filters overlapping corresponding ones of the plurality of holes of the light blocking layer and overlapping corresponding ones of the plurality of emission areas, wherein the light blocking layer includes a first light blocking layer and a second light blocking layer disposed on the first light blocking layer, the second light blocking layer having a width smaller than a width of the first light blocking layer, in the first display area, the plurality of color filters disposed adjacent to each other are spaced apart from each other by a distance at locations corresponding to the second light blocking layer, in the second display area, the plurality of color filters are not disposed on the plurality of light transmitting areas and the second light blocking layer is disposed to surround ones of the plurality of light transmitting areas, and a diameter of each of the plurality of openings of the pixel defining film is smaller than a diameter of a corresponding one of the plurality of holes of the light blocking layer.

2. The display device of claim 1, wherein a difference between the width of the first light blocking layer and the width of the second light blocking layer is at least about 4 μm, and a thickness of the first light blocking layer is smaller than a thickness of the second light blocking layer.

3. The display device of claim 2, wherein the thickness of the first light blocking layer is in a range of about 1.5 μm to about 2.5 μm, and the thickness of the second light blocking layer is in a range of about 1.5 μm to about 4 μm.

4. The display device of claim 2, wherein the width of the first light blocking layer is at least about 13 μm, and the width of the second light blocking layer is at least about 9 μm.

5. The display device of claim 1, wherein the second light blocking layer and the first light blocking layer are integral with each other.

6. The display device of claim 1, wherein a portion of an upper surface of the second light blocking layer does not overlap the plurality of color filters.

7. The display device of claim 6, wherein a portion of an upper surface of the first light blocking layer disposed in the second display area does not overlap the plurality of color filters and the second light blocking layer.

8. The display device of claim 6, wherein the second light blocking layer is disposed adjacent to one of both sides of the first light blocking layer in a width direction on the first light blocking layer.

9. The display device of claim 8, wherein in the second display area, the second light blocking layer surrounds ones of the plurality of light transmitting areas.

10. The display device of claim 1, wherein each of the plurality of emission areas includes a first emission area, a second emission area spaced apart from the first emission area in a first direction, and a third emission area spaced apart from the second emission area in a second direction intersecting the first direction, and each of the plurality of color filters includes a first color filter overlapping the first emission area, a second color filter overlapping the second emission area, and a third color filter overlapping the third emission area.

11. The display device of claim 10, wherein an area of the first color filter in a plan view is greater than or equal to areas of each of the second color filter and the third color filter in a plan view.

12. The display device of claim 11, wherein the area of the first color filter in a plan view is greater than the area of the third color filter in a plan view, and the second color filter has a shape in which it extends in a plan view.

13. A display device comprising:

a plurality of emission areas disposed in a first direction, a second direction intersecting the first direction, and a third direction intersecting the first direction and the second direction, each of the plurality of emission areas including a light emitting element;

a plurality of light transmitting areas disposed between ones of the plurality of emission areas, each of the plurality of light transmitting areas being absent of the light emitting element;

a light blocking layer including a plurality of holes, each of the plurality of holes overlapping corresponding ones of the plurality of emission areas and corresponding ones of the plurality of light transmitting areas, the light blocking layer being disposed to surround ones of the plurality of emission areas and ones of the plurality of light transmitting areas; and a plurality of color filters disposed in corresponding ones of the plurality of holes of the light blocking layer and overlapping corresponding ones of the plurality of emission areas, wherein each of the plurality of emission areas includes a first emission area, a second emission area spaced apart from the first emission area in the first direction, and a third emission area spaced apart from the second emission area in the second direction, each of the plurality of color filters includes a first color filter overlapping the first emission area, a second color filter overlapping the second emission area, and a third color filter overlapping the third emission area, portions of the second color filter are disposed on portions of the first color filter adjacent thereto in the first direction and on portions of the third color filter adjacent thereto in the second direction, and the light blocking layer includes a first light blocking layer and a color pattern disposed on the first light blocking layer, wherein the plurality of holes are disposed in the first light blocking layer, and wherein the color pattern is disposed to be adjacent to one of the plurality of holes, the color pattern having a width smaller than that of the first light blocking layer, and wherein the color pattern is configured to prevent an overflow of the plurality of color filters into the one of the plurality of holes.

14. The display device of claim 13, wherein the color pattern includes a same colorant as the first color filter, and portions of the first color filter adjacent to ones of the plurality of light transmitting areas and the color pattern are integral with each other.

15. The display device of claim 14, wherein the second color filter overlaps each of the first color filter and the third color filter at locations corresponding to the first light blocking layer.

16. The display device of claim 14, wherein a portion of the third color filter is disposed on the first color filter at a location corresponding to the first light blocking layer.

17. The display device of claim 13, wherein a difference between the width of the first light blocking layer and the width of the color pattern is at least about 4 μm.

18. The display device of claim 13, wherein portions of the light blocking layer disposed around ones of the plurality of emission areas are covered by the plurality of color filters, and a portion of an upper surface of the light blocking layer disposed around ones of the plurality of light transmitting areas does not overlap the plurality of color filters.

19. The display device of claim 13, wherein each of the plurality of holes of the light blocking layer has a greater area than corresponding ones of the plurality of emission areas, and each of the first color filter, the second color filter, and the third color filter has a greater area than a corresponding one of the plurality of holes.

20. An electronic device comprising:

a display device including:

a plurality of emission areas, each of the plurality of emission areas including a light emitting element, wherein some of the plurality of emission areas are disposed in a first display area and others of the plurality of emission areas are disposed in a second display area;

a plurality of light transmitting areas disposed in the second display area, each of the plurality of light transmitting areas being absent of the light emitting element;

a pixel defining film including a plurality of openings, the plurality of openings overlapping corresponding ones of the plurality of emission areas and/or corresponding ones of the plurality of light transmitting areas;

a light blocking layer including a plurality of holes overlapping corresponding ones of the plurality of emission areas and/or corresponding ones of the plurality of light transmitting areas, the light blocking layer being disposed between adjacent ones of the plurality of emission areas and between adjacent ones of the plurality of light transmitting areas; and a plurality of color filters overlapping corresponding ones of the plurality of holes of the light blocking layer and overlapping corresponding ones of the plurality of emission areas, wherein the light blocking layer includes a first light blocking layer and a second light blocking layer disposed on the first light blocking layer, the second light blocking layer having a width smaller than a width of the first light blocking layer, in the first display area, the plurality of color filters disposed adjacent to each other are spaced apart from each other by a distance at locations corresponding to the second light blocking layer, in the second display area, the plurality of color filters are not disposed on the plurality of light transmitting areas and the second light blocking layer is disposed to surround ones of the plurality of light transmitting areas, and a diameter of each of the plurality of openings of the pixel defining film is smaller than a diameter of a corresponding one of the plurality of holes of the light blocking layer.

* * * * *